United States Patent
Kimura et al.

(10) Patent No.: US 8,014,186 B2
(45) Date of Patent: Sep. 6, 2011

(54) FERROELECTRIC MEMORY DEVICE AND OPERATING METHOD FOR THE SAME

(75) Inventors: Hiromitsu Kimura, Kyoto-fu (JP); Takaaki Fuchikami, Kyoto-fu (JP); Yoshikazu Fujimori, Kyoto-fu (JP)

(73) Assignee: Rohm Co., Ltd., Kyoto-fu (JP)

( * ) Notice: Subject to any disclaimer, the term of this patent is extended or adjusted under 35 U.S.C. 154(b) by 145 days.

(21) Appl. No.: 12/428,517

(22) Filed: Apr. 23, 2009

(65) Prior Publication Data
US 2009/0268504 A1 Oct. 29, 2009

(30) Foreign Application Priority Data
Apr. 28, 2008 (JP) .................................. 2008-117319

(51) Int. Cl.
*G11C 11/22* (2006.01)

(52) U.S. Cl. ... 365/145; 365/49.1; 365/117; 365/230.06

(58) Field of Classification Search .................. 365/145, 365/117, 49.1, 230.06
See application file for complete search history.

(56) References Cited

U.S. PATENT DOCUMENTS

| 6,504,780 | B2 | 1/2003 | Leung |
| 7,130,211 | B2 * | 10/2006 | Kang ............................ 365/145 |
| 7,518,944 | B2 * | 4/2009 | Miyamoto ............... 365/230.06 |
| 7,778,078 | B2 * | 8/2010 | Nagadomi et al. ........ 365/185.09 |
| 2007/0016719 | A1 * | 1/2007 | Ono et al. ...................... 711/103 |

FOREIGN PATENT DOCUMENTS

| JP | 06-125056 | 5/1994 |
| JP | 08-203266 | 8/1996 |
| JP | 2002-526882 | 8/2002 |

* cited by examiner

*Primary Examiner* — Pho M Luu
(74) *Attorney, Agent, or Firm* — Fish & Richardson P.C.

(57) ABSTRACT

A ferroelectric memory device includes: a plurality of memory banks configured to include a memory cell array composed of a ferroelectric memory; a cache bank configured to be bus-connected with the memory banks, and for copying data stored in the memory banks; and a memory bank/cache control sequencer for accessing and refreshing to the memory banks and the cache bank, wherein a random access control to the ferroelectric memory is possible during each memory cycle without delay of refresh operation.

19 Claims, 13 Drawing Sheets

FIG. 12A
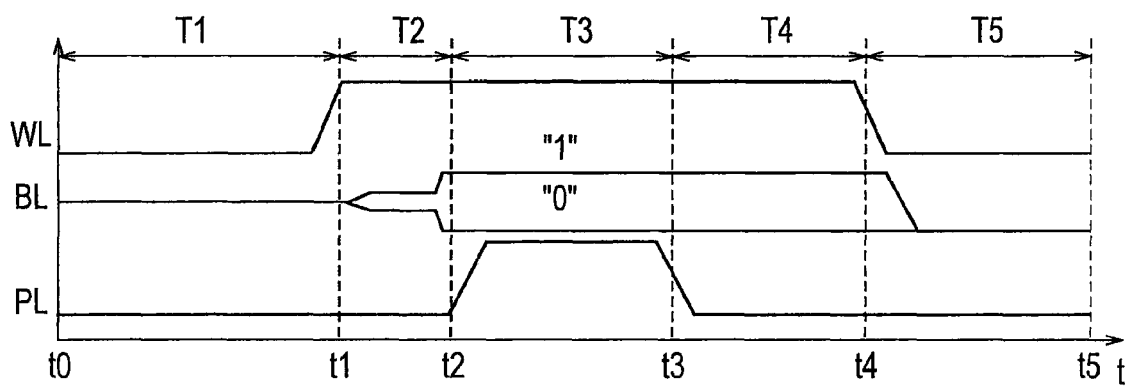
FIG. 12B    FIG. 12C    FIG. 12D    FIG. 12E
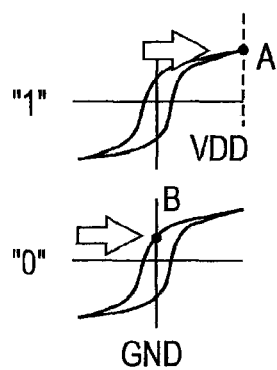 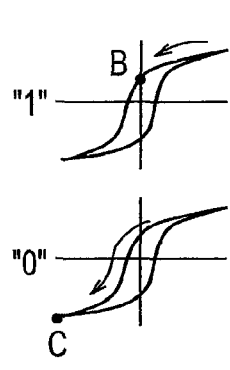 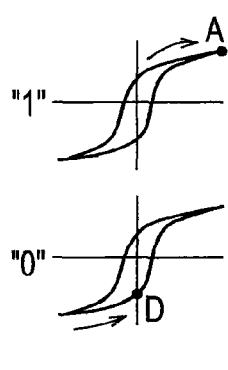 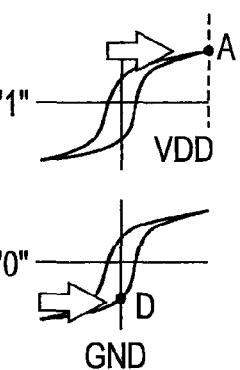

FERROELECTRIC MEMORY DEVICE AND OPERATING METHOD FOR THE SAME

CROSS REFERENCE TO RELATED APPLICATIONS AND INCORPORATION BY REFERENCE

This application is based upon and claims the benefit of priority from prior Japanese Patent Applications No. P2008-117319 filed on Apr. 28, 2008, the entire contents of which are incorporated herein by reference.

TECHNICAL FIELD

The present invention relates to a ferroelectric memory device and an operation method for the ferroelectric memory device. In particular, in a ferroelectric memory device for adjusting the capacitor of a bit line to which a memory cell is connected, the present invention relates to a ferroelectric memory device in which random access is possible to a memory cell between each memory cycle without delay of refresh operation (without refresh penalty), and an operation method for the same.

BACKGROUND ART

FRAM™ (Ferroelectric Random Access Memory) has achieved the non-volatility of stored data (for example, retaining performance for about ten years), and the excellent characteristics of the high speed data write-in performance for about several 10 ns for example, by using the hysteresis characteristic which a ferroelectric capacitor has.

On the other hand, since it is necessary to drive comparatively large capacitor for control of the hysteresis characteristic of the ferroelectric capacitor, it is difficult to achieve a high-speed operation of an SRAM (Static Random Access Memory) level, which has the access time for about several ns for example, in the present condition. Moreover, since the characteristics of the ferroelectric capacitor deteriorated gradually whenever it repeated polarization inversion, there was a problem that a number of times of data rewriting is limited to about $10^{14}$ times per one capacitor.

In order to solve this problem, there is a method of using a ferroelectric capacitor as a mere capacitive element at the time of normal operation, executing a DRAM (Dynamic Random Access Memory) mode operation for holding data with quantity of electrical charges charged up, and executing an FRAM mode operation for applying data into non-volatilizing using the hysteresis characteristic only at the time of power supply cutoff (for example, refer to Patent Literature 1 and Patent Literature 2).

In this method, since improvement in the speed of operation can be achieved by not using the hysteresis characteristic at the time of normal operation, but reducing the capacitor to drive, and polarization inversion is not occurred, it is effective in the ability to suppress the characteristic degradation of a device.

In the DRAM mode, it becomes advantageous to high-speed operation so that the capacitor of the BL (Bit Line) to which a memory cell is connected is small, but by one side, in the FRAM mode, in order to read residual polarization electrical charges, great BL capacitor is needed. Since the BL capacitor can be applied small by this trade-off only in the range in which the FRAM mode can operate, improvement in the speed has a limit.

When holding data also in a power OFF period, it is necessary to execute data write-in with the FRAM mode for the memory cell, which is operating in the DRAM mode, and to apply the data into non-volatilizing, at the time of power supply cutoff. For this reason, the operating time in the FRAM mode needed at the time of power supply cutoff becomes long as memory space becomes large.

Furthermore, there is a problem that a data transfer rate deteriorates since it cannot be treated as well as SRAM and is incompatible by restrictions that access is impossible from external during the refresh cycle (refresh penalty).

Although a refresh penalty is reducible to some extent if a method to divide and compose a memory into a plurality of banks, and to refresh except the bank for an external access request is used, the refresh penalty occurs since the external access is refused when a certain specific bank A is refreshed, when the access request occurs concentrating on the specific bank A.

As a method to solve this problem, a technology of concealing a refresh cycle completely by preparing a cache memory for the inside of a memory, and executing refresh operation when a cache hits for the access request from the outside (a memory cell array is not accessed) is proposed (for example, refer to Patent Literature 3). In Patent Literature 3, a read-out/write-in buffer for preventing from being affected by the influence of refresh of semiconductor memory, and an operation method for the same, are disclosed.

CITATION LIST

Patent Literature 1: Japanese Patent Application Laying-Open Publication No. H06-125056
Patent Literature 2: Japanese Patent Application Laying-Open Publication No. H08-203266
Patent Literature 3: Japanese Patent Application Laying-Open Publication No. 2002-526882

SUMMARY OF THE INVENTION

Technical Problem

When the BL capacitor is unchanged, it is necessary to set up a capacitance value within limits, which can operate in both the DRAM mode and the FRAM mode. For this reason, there was a limit to achieve improvement in the speed by reduction of the BL capacitor. Although the subject of FRAM in a hybrid memory use is in improvement in an access speed, in the non-volatile (FRAM) operation with large capacitor load, improvement in the speed is difficult.

Moreover, the technology of above-mentioned Patent Literature 3 has restrictions that it is not applicable if refresh cycle time is not shorter than the memory access time. This is because it is only a worth of one memory access time during the period, which can be refreshed securable with cache (period whose memory array is in a no access state).

The object of the present invention is to provide a ferroelectric memory device and an operation method for the ferroelectric memory device which is compatible in improvement in the speed by the BL capacitor reducible in the DRAM mode and the BL capacitor securing in the FRAM mode by providing a load capacitor adjustment cell on the BL, and setting up the capacitor on the BL separately in the DRAM mode and the FRAM mode, does not affect to an external access request, and can set up the period which can be refreshed regardless of the memory access time.

Solution to Problem

According to an aspect of the present invention, a ferroelectric memory device comprises a plurality of memory banks configured to include a memory cell array composed of a ferroelectric memory; a cache bank configured to be bus-connected with the memory banks, and for copying data stored in the memory banks; and a memory bank/cache control sequencer for accessing and refreshing to the memory banks and the cache bank, wherein a random access control to the ferroelectric memory is possible during each memory cycle without delay of refresh operation.

According to another aspect of the invention, an operating method for a ferroelectric memory device comprises copying beforehand data currently held at one of a memory cell for refresh and a memory block to a cache bank when refreshing; using the data stored in the cache bank and continuing the refresh processing when an external access request is sent to the memory block in the refresh processing; and writing back the data stored in the cache bank to the memory block after completing of the refresh, wherein the ferroelectric memory device comprises a plurality of memory banks configured to include a memory cell array composed of a ferroelectric memory; the cache bank configured to be bus-connected with the memory banks, and for copying data stored in the memory banks; and a memory bank/cache control sequencer for accessing and refreshing to the memory banks and the cache bank.

According to another aspect of the invention, an operating method for a ferroelectric memory device comprises determining whether a cache memory has target data when the ferroelectric memory device is accessed; accessing the cache memory when the cache memory has target data and when being a cache hit; accessing a target memory bank in the case of read-out when the cache memory has target data and when being a cache miss; and writing back the data stored in the cache memory to an original memory bank in the case of write-in when the cache memory has target data and when being a cache miss, wherein the ferroelectric memory device comprises a plurality of memory banks configured to include a memory cell array composed of a ferroelectric memory; the cache bank configured to be bus-connected with the memory banks, and for copying data stored in the memory banks; a memory bank/cache control sequencer for accessing and refreshing to the memory banks and the cache bank; and a cache memory configured to include a determination circuit for determining whether there is any target data when accessed.

Advantageous Effects of the Invention

According to the present invention, it is compatible in improvement in the speed by the BL capacitor reducible in the DRAM mode and the BL capacitor securing in the FRAM mode by providing the load capacitor adjustment cell on the BL, and setting up the capacitor on the BL separately in the DRAM mode and the FRAM mode.

According to the present invention, the ferroelectric memory device which can improve in the speed of the data restoring process at the time of power supply cutoff, does not affect the external access request, and can set up the period which can be refreshed regardless of the memory access time, can be provided by operating in the DRAM operational mode with small capacitor load for high-speed operation at the time of normal operation, and operating in the FRAM operational mode for holding the data during the power OFF period at the time of power ON/OFF.

According to the present invention, the operation method of the ferroelectric memory device, which can conceal refresh processing completely can be provided even when the refresh cycle time is longer than the memory access time.

Moreover, the ferroelectric memory device which does not affect to the external access request, and can set up the period which can be refreshed regardless of the memory access time, can be provided.

According to the present invention, the operation method of the ferroelectric memory device which can suppress the characteristic degradation of the ferroelectric device and can conceal refresh operation completely by reduction of the number of times of polarization inversion can be provided.

BRIEF DESCRIPTION OF DRAWINGS

FIG. 12A shows an operation example of the ferroelectric memory device according to the first embodiment of the present invention, and is an operation waveform chart of the ferroelectric memory cell at the time of refresh operation.

FIG. 12B shows an operation example of the ferroelectric memory device according to the first embodiment of the present invention, and is an operation explanatory diagram on the hysteresis characteristic at the time of the normal operation (DRAM operational mode) for holding data only with quantity of electrical charges charged up.

FIG. 12C shows an operation example of the ferroelectric memory device according to the first embodiment of the present invention, and is an operation explanatory diagram on the hysteresis characteristic at the time of a data write-in operation (FRAM operational mode).

FIG. 12D shows an operation example of the ferroelectric memory device according to the first embodiment of the present invention, and is an operation explanatory diagram on the hysteresis characteristic at the time of the data write-in operation (FRAM operational mode).

FIG. 12E shows an operation example of the ferroelectric memory device according to the first embodiment of the present invention, and is an operation explanatory diagram on the hysteresis characteristic at the time of the normal operation (DRAM operational mode) for holding data by both the quantity of electrical charges charged up and the quantity of electrical charges of residual polarization.

DESCRIPTION OF EMBODIMENTS

Figure 1:
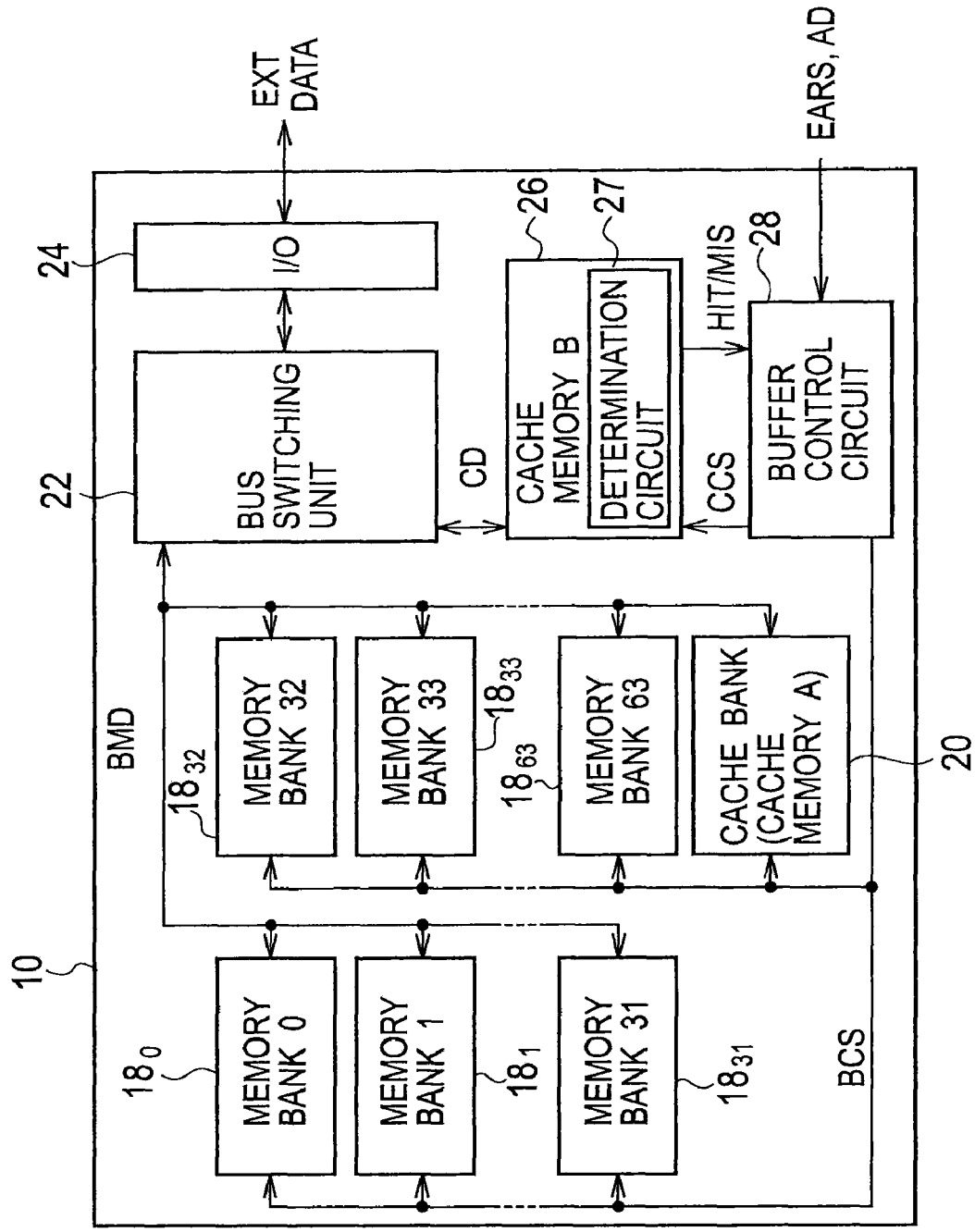
FIG. 1 is a schematic block configuration diagram of a ferroelectric memory device according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally, and as is conventional in the representation of the circuit blocks, it will be appreciated that the various drawings are not drawn to scale from one figure to another nor inside a given figure, and in particular that the circuit diagrams are arbitrarily drawn for facilitating the reading of the drawings. In the following descriptions, numerous specific details are set forth such as specific signal values, etc. to provide a thorough understanding of the present invention. However, it will be obvious to those skilled in the art that the present invention may be practiced without such specific details. In other instances, circuits well-known have been shown in block diagram form in order to not obscure the present invention with unnecessary detail.

The embodiments shown below exemplify an apparatus and a method that are used to implement the technical ideas according to the present invention, and do not limit the embodiments according to the present invention to those that appear below. These embodiments, according to the present invention, may receive a variety of modifications that fall within the claims.

First Embodiment (Ferroelectric Memory Device)

As shown in FIG. 1, a ferroelectric memory device 10 according to a first embodiment of the present invention includes: a plurality of memory banks $18_0$, $18_1$, ..., $18_{62}$ and $18_{63}$; a cache bank 20 composed of a cache memory A; a bus switching unit 22; an I/O control unit 24; a cache memory B 26; and a buffer control circuit 28.

The plurality of memory banks $18_0$, $18_1$, ..., $18_{62}$ and $18_{63}$ compose the ferroelectric memory of which each are independent, and execute write-in, read-out, and holding of data in each memory bank unit.

The plurality of memory banks $18_0$, $18_1$, ..., $18_{62}$ and $18_{63}$ and the cache bank 20 are connected to the bus switching unit 22 through the bank memory data bus BMD.

Similarly, the cache memory B 26 and the bus switching unit 22 are connected mutually, and transmit and receive cache data CD.

The bus switching unit 22 is connected to the I/O control unit 24, and switches the bank memory data from the plurality of memory banks $18_0$, $18_1$, ..., $18_{62}$ and $18_{63}$ and the cache bank 20 and the cache data CD from the cache memory B 26.

When the plurality of memory banks $18_0$, $18_1$, ..., $18_{62}$ and $18_{63}$ connect with external, the I/O control unit 24 provides an interface compatible with SRAM for the external, and transmits and receives external data EXT DATA.

The buffer control circuit 28 receives an external access request signal EARS and a memory address signal AD, and sends a cache control signal CGS to the cache memory B 26. Moreover, the buffer control circuit 28 receives a hit/miss hit signal HIT/MIS from the cache memory B 26, and sends a bank control signal BCS to the plurality of memory banks $18_0$, $18_1$, ..., $18_{62}$ and $18_{63}$ and the cache bank 20.

When the 1M bit FRAM is composed, the plurality of memory banks $18_0$, $18_1$, ..., $18_{62}$ and $18_{63}$ have memory space of 16 k bits for example, respectively. The cache bank 20 also has memory space of 16 k bits, for example.

When the ferroelectric memory device 10 is accessed, the memory bank which has the target memory address is not accessed, but it is checked whether, first of all, the cache memory B 26 has the target data. The cache memory B 26 has a determination circuit 27 for determining whether or not there is any target data. When the cache memory B 26 has the target data (cache hit), it is accessed by the cache memory B 26 in which high-speed access is possible. When there is no target data in the cache memory B 26 (cache miss), it accesses to the target memory bank in the case of read-out. Moreover, in the case of write-in, the data of the cache memory B 26 may be rewritten caused by the cache miss. In this case, the operations which return the data stored in the cache memory B 26 until now to the original memory bank are called "write back".

The cache bank 20 is used in order to restore the data of the memory bank in the case of refresh of the memory bank. Since the ferroelectric memory device 10 has the cache bank 20 of the same size as the memory banks 0-63, the restoration of the data is easy. Since the cache bank 20 has the same configuration as each memory bank, it is easy to adjust operation timing. Moreover, it is also easy to perform bus wiring and to share a signal. The ferroelectric memory device 10 has a bus wiring cache read-out signal line CRDL and the cache write-in signal line CWDL for exclusive use for using for the data copy etc. between the memory banks 0-63 and the cache bank 20.

(Configuration Example of Bank)

Figure 5:
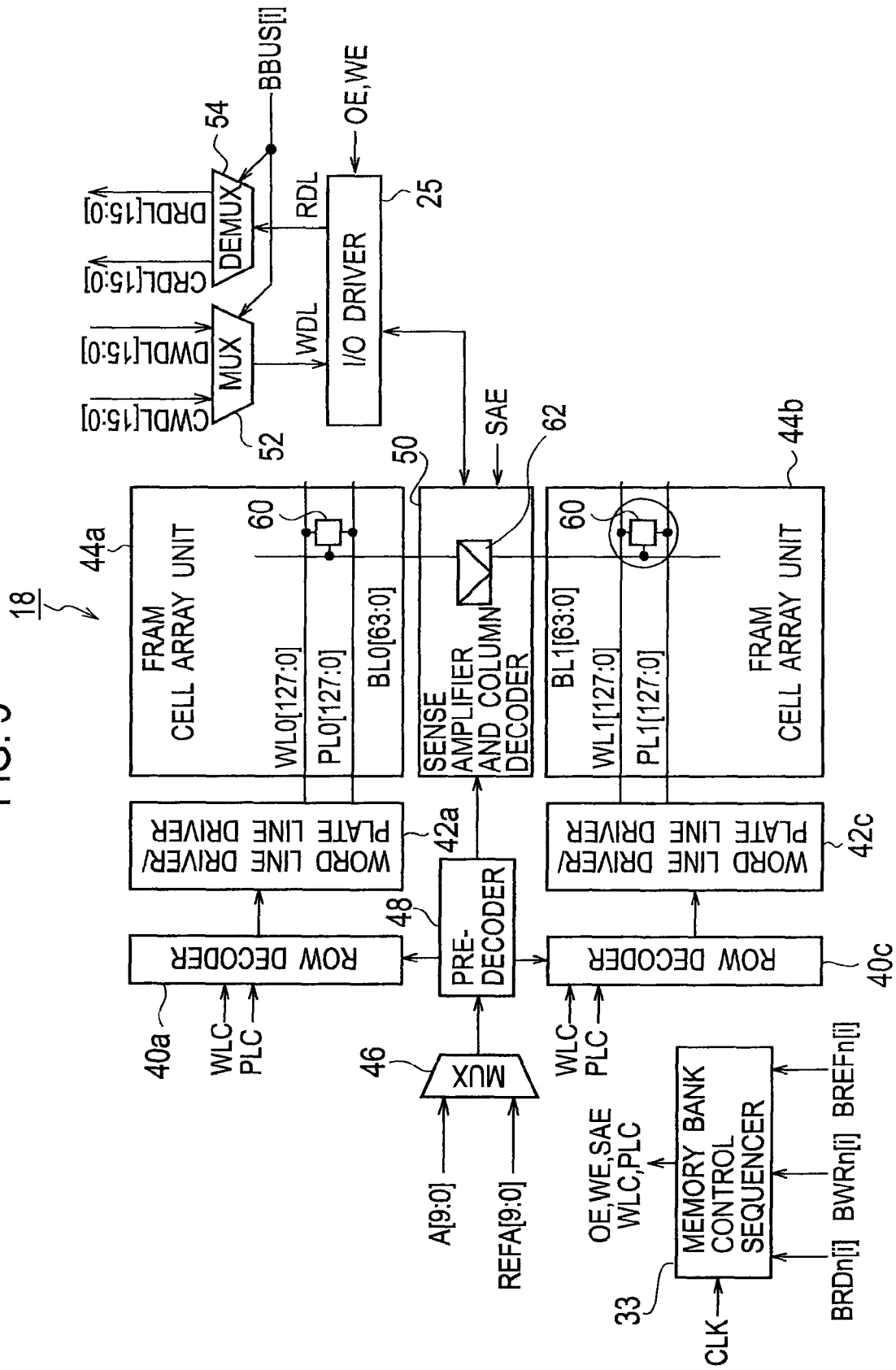
FIG. 5 is a schematic block configuration diagram of a configuration example of the one memory bank of the ferroelectric memory device according to the first embodiment of the present invention.

The detailed schematic block configuration example of the one memory bank 18 of the ferroelectric memory device 10 according to the first embodiment is expressed, for example, as shown in FIG. 5. That is, one of the memory bank 18 includes: FRAM cell array units 44a, 44b; a common sense amplifier and column decoder 50 placed adjoining in the column direction for the FRAM cell array units 44a, 44b; a WL/PL driver 42a placed adjoining of the row direction for the FRAM cell array unit 44a; a WL/PL driver 42c placed adjoining of the row direction for the FRAM cell array unit 44b; a row decoder 40a placed adjoining of the column direction for the WL/PL driver 42a; and a row decoder 40c placed adjoining of the column direction for the WL/PL driver 42c.

The memory bank 18 further includes a predecoder 48 placed adjoining of the row decoders 40a, 40c and the sense amplifier and column decoder 50.

Furthermore, for example, a multiplexer 46, a memory bank control sequencer 33, a multiplexer 52, a demultiplexer 54, and an I/O driver 25 are placed around the FRAM cell array units 44a, 44b, the row decoders 40a, 40c, the sense amplifier and column decoder 50, and the predecoder 48.

In addition, in more detail, although the memory bank 18 of the first embodiment further includes BLC (load capacitor adjustment array unit) 66a, 66b, row decoders 40b, 40d, and WL/PL drivers 42b, 42d, it is not shown in FIG. 5. It will explain separately later with reference to FIG. 2.

The sense amplifier and column decoder 50 is connected to the I/O driver 25.

A clock signal CLK, a memory bank read-out request signal BRDn [i], a memory bank write-in request signal BWRn [i], and a memory bank refresh request signal BREFn are supplied to the memory bank control sequencer 33.

An output control signal OE, an input control signal WE, a sense amplifier control signal SAE, a word line control signal WLC, and a plate line control signal PLC are outputted from the memory bank control sequencer 33.

The sense amplifier control signal SAE is supplied to the sense amplifier and column decoder 50.

An address signal A [9:0] and a refresh/copy selected address signal REFA is supplied to the predecoder 48 through the multiplexer 46.

The multiplexer 52 and the demultiplexer 54 are connected to the I/O driver 25.

A cache write-in signal line CWDL [15:0] and a data write-in signal line DWDL [15:0] are connected to the input of the multiplexer 52, and a write-in data signal WDL is supplied to the I/O driver 25 from the output of the multiplexer 52.

The output control signal OE and the input control signal WE are supplied to the I/O driver 25.

A read-out data signal RDL from the I/O driver 25 is supplied to the demultiplexer 54, and the output of the demultiplexer 54 is connected to a cache read-out signal line CRDL [15:0] and a data read-out signal line DRDL [15:0].

Moreover, a bus select signal BBUS [i] is supplied to the multiplexer 52 and the demultiplexer 54.

A plurality of word lines WL0 [127:0], a plurality of plate lines PL0 [127:0], and a bit line capacitor control line BLC [2:0] (not shown) are extended by the row direction from the WL/PL driver 42a to the FRAM cell array unit 44a. In this case, although illustration is omitted, the bit line capacitor control line BLC [2:0] is connected to the load capacitor adjustment array unit 66a in the FRAM cell array unit 44a.

Similarly, a plurality of word lines WL1 [127:0], a plurality of plate lines PL1 [127:0], and a bit line capacitor control line BLC [2:0] (not shown) are extended by the row direction from the WL/PL driver 42c to the FRAM cell array unit 44b. In this case, although illustration is omitted, the bit line capacitor control line BLC [2:0] is connected to the load capacitor adjustment array unit 66b in the FRAM cell array unit 44b.

A plurality of bit lines BL0 [63:0] and BL0n [63:0] in the FRAM cell array unit 44a are extended by the column direction, and are connected to the sense amplifier 62 in the sense amplifier and column decoder 50.

Similarly, a plurality of bit lines BL1 [63:0] and BL1n [63:0] in the FRAM cell array unit 44b are extended by the column direction, and are connected to the sense amplifier 62 of the sense amplifier and column decoder 50.

A ferroelectric memory cell 60 is placed at matrix form in the FRAM cell array units 44a, 44b, respectively, and a load capacitor adjustment cell 64 is placed, respectively in the load capacitor adjustment array units 66a, 66b (not shown) in the FRAM cell array units 44a, 44b.

A plate line control signal PLC, a word line control signal WLC, and a bit line capacitor control signal BLCC [2:0] (not shown) are inputted into the row decoders 40a, 40c.

A line address signal AR [7:0] (not shown) is inputted into the row decoders 40a, 40c from the predecoder 48.

Figure 3:
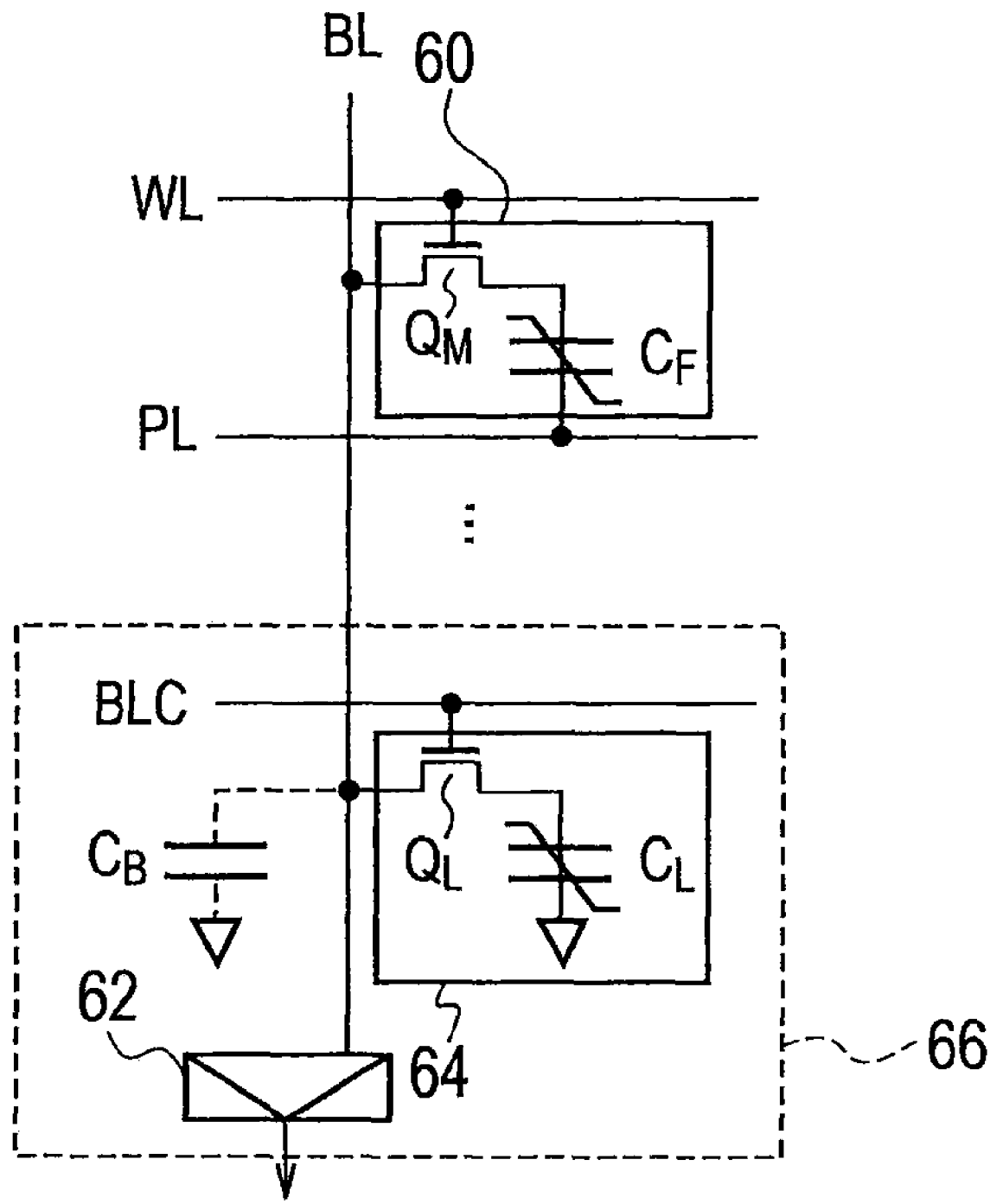
FIG. 3 is a schematic circuit configuration chart of a ferroelectric memory cell and a load capacitor adjustment cell taken in a bit line BL of the ferroelectric memory device according to the first embodiment of the present invention.

In the configuration example of the memory bank 18 of FIG. 5, the schematic circuit configuration of the ferroelectric memory cell 60 taken in the bit line BL and the load capacitor adjustment cell 64 is similarly expressed as FIG. 3. For the ferroelectric memory cell 60, the load capacitor switching unit 66 is placed and the capacitance value of bit line BL is adjusted.

The load capacitor adjustment cell 64 is composed of same structure as the ferroelectric memory cell 60 for data holds, and obtains load capacitor $C_L$ by performing parallel connection of a plurality of ferroelectric memory cells 60 which are composed of a memory cell transistor $Q_M$ and a ferroelectric capacitor $C_F$.

Figure 2:
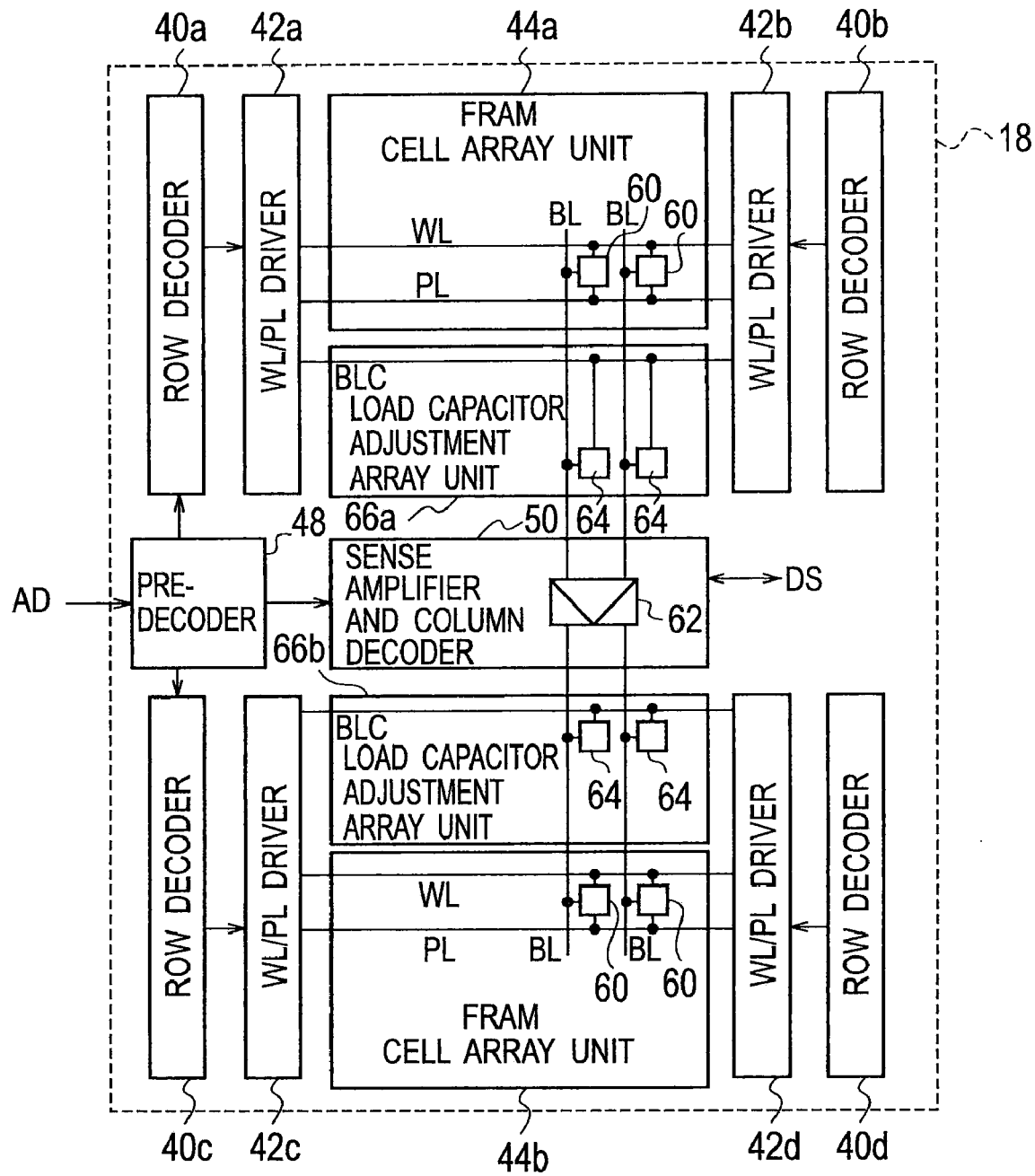
FIG. 2 is a schematic block configuration diagram of one memory bank of the ferroelectric memory device according to the first embodiment of the present invention.

In this case, although illustration is omitted, the FRAM cell array units 44a, 44b achieves easily the configuration which includes the load capacitor adjustment array units 66a, 66b inside by composing the load capacitor adjustment cell 64 from same structure as the ferroelectric memory cell 60 for data holds, as well as the circuit configuration of FIG. 2. Moreover, the process variation at the time of production can be reduced by applying the load capacitor adjustment cell 64 into the same structure as the ferroelectric memory cell 60. However, it is effective also considering not one limited to this but the load capacitor adjustment cell 64 as an alternative configuration from the ferroelectric memory cell 60.

When composing 1M bit FRAM, the memory space of the FRAM cell array units 44a, 44b become memory space of 64 bits×128 word, respectively, for example.

Next, the memory bank 18 will be explained including the BLC (load capacitor adjustment array unit) 66a, 66b, the row decoders 40b, 40d, and the WL/PL drivers 42b, 42d which are shortened with FIG. 5.

As shown in FIG. 2, for example, the memory bank 18 includes: the FRAM cell array units 44a, 44b; the load capacitor adjustment array units 66a, 66b placed adjoining of the column direction at the FRAM cell array units 44a, 44b, respectively; the sense amplifier and column decoder 50 placed in common adjoining in the column direction at the load capacitor adjustment array units 66a, 66b; the WL/PL (Word Line/Plate Line) drivers 42a, 42b and 42c, 42d placed adjoining of the row direction at the FRAM cell array units 44a, 44b; the row decoders 40a, 40b and 40c, 40d placed adjoining in the column direction, at the WL/PL (Word Line/Plate Line) drivers 42a, 42b and 42c, 42d, respectively; and the predecoder 48 which is placed adjoining of the row decoders 40*a*, 40*c* and the sense amplifier and column decoder 50, and receives the address signal AD. The sense amplifier and column decoder 50 outputs a data signal DS.

A plurality of word lines WL and a plurality of plates line PL are extended by the row direction from the WL/PL (Word Line/Plate Line) drivers 42*a*, 42*b* to the FRAM cell array unit 44*a*. Similarly, a plurality of word lines WL and a plurality of plates line PL are extended by the row direction from the WL/PL (Word Line/Plate Line) drivers 42*c*, 42*d* to the FRAM cell array unit 44*b*.

Moreover, the bit line capacitor control line BLC is extended by the row direction from the WL/PL (Word Line/Plate Line) drivers 42*a*, 42*b* to the load capacitor adjustment array unit 66*a*. Similarly, the bit line capacitor control line BLC is extended by the row direction from the WL/PL (Word Line/Plate Line) drivers 42*c*, 42*d* to the load capacitor adjustment array unit 66*b*.

The plurality of bit lines BL in the FRAM cell array units 44*a*, 44*b* are extended in the column direction, and are connected to the sense amplifier 62 in the common sense amplifier and column decoder 50.

The ferroelectric memory cells 60 are placed at matrix form in the FRAM cell array units 44*a*, 44*b*, and the load capacitor adjustment cells 64 are placed in the load capacitor adjustment array units 66*a*, 66*b*.

Although the FRAM cell array unit showed the example divided into two in the example shown in FIG. 2, the number of FRAM cell array units may be one. Moreover, although every two row decoders and every two WL/PL drivers which are placed at the row direction showed the example placed for one FRAM cell array unit in the example shown in FIG. 2, the row decoder and the WL/PL driver may be one every.

In the ferroelectric memory device according to the first embodiment, as shown in FIG. 3, a schematic circuit configuration of the ferroelectric memory cell 60 and the load capacitor adjustment cell 64 which are taken in the bit line BL includes: a plurality of bit lines BL placed in the column direction; a plurality of word lines WL which are intersected perpendicularly with the bit line BL, and are placed at the row direction; a plurality of plate lines PL which are intersected perpendicularly with the bit line BL, and are placed at the row direction; the bit line capacitor control line BLC which is intersected perpendicularly with the bit line BL and is placed at the row direction; the ferroelectric memory cell 60 which is placed at the intersection of a plurality of bit lines BL, a plurality of word lines WL and the plate lines PL, and is composed of the ferroelectric capacitor $C_F$ and the memory cell transistor $Q_M$; and the load capacitor adjustment cell 64 which is placed at the intersection of a plurality of bit lines BL and the bit line capacitor control line BLC, and is composed of the load capacitor $C_L$ and the load capacitor adjustment transistor $Q_L$.

The electrode one side of the ferroelectric capacitor $C_F$ is connected to the plate line PL. The electrode of another side of the ferroelectric capacitor $C_F$ is connected to the one side of a source or a drain of the memory cell transistor $Q_M$. Another side of the source or the drain of the memory cell transistor $Q_M$ is connected to the bit line BL. A gate of the memory cell transistor $Q_M$ is connected to the word line WL.

The electrode of one side of the load capacitor $C_L$ is connected to ground potential. The electrode of another side of the load capacitor $C_L$ is connected to the one side of a source or a drain of the load capacitor adjustment transistor $Q_L$. Another side of the source or the drain of the load capacitor adjustment transistor $Q_L$ is connected to bit line BL. A gate of the load capacitor adjustment transistor $Q_L$ is connected to the bit line capacitor control line BLC.

The ferroelectric capacitor $C_F$ includes at least one ferroelectric thin film layer.

The data in the ferroelectric memory cell 60 is held by the quantity of electrical charge charged by the ferroelectric capacitor $C_F$ or the quantity of electrical charges of residual polarization inside the ferroelectric thin film layer.

In the ferroelectric memory device according to the first embodiment, as shown in FIG. 3, for the ferroelectric memory cell 60, the load capacitor switching unit 66 is placed and the capacitance value of the bit line BL is adjusted.

The load capacitor switching unit 66 is composed of the bit line capacitor control line BLC, the load capacitor adjustment cell 64 composed of the load capacitor $C_L$ and the load capacitor adjustment transistor $Q_L$, the sense amplifier 62 connected to the bit line BL, and the bit line capacitor $C_B$, as shown in FIG. 3.

By applying the bit line capacitor control line BLC into a high level, the load capacitor adjustment transistor $Q_L$ is in conductive state, and the capacitance value of bit line BL is increased to the large capacity of $C_B+C_L$. On the other hand, by applying the bit line capacitor control line BLC into a low level, the load capacitor adjustment transistor $Q_L$ is in OFF state, and, as for the capacitance value of the bit line BL, the state of the small capacity of $C_B$ is kept up.

The load capacitor adjustment cell 64 can be composed of same structures as the ferroelectric memory cell 60 for data holds. For example, the load capacitor $C_L$ can also be obtained by performing one or more parallel connection of the same structure as the ferroelectric memory cell 60 which is composed of the memory cell transistor $Q_M$ and ferroelectric capacitor $C_F$. Therefore, since the load capacitor adjustment cell 64 is connected to BL through the load capacitor adjustment transistor $Q_L$ only at the time of the FRAM mode, the load capacitor adjustment cell 64 can simplify a configuration.

(Configuration Example of 1M Bit FRAM)

Figure 4:
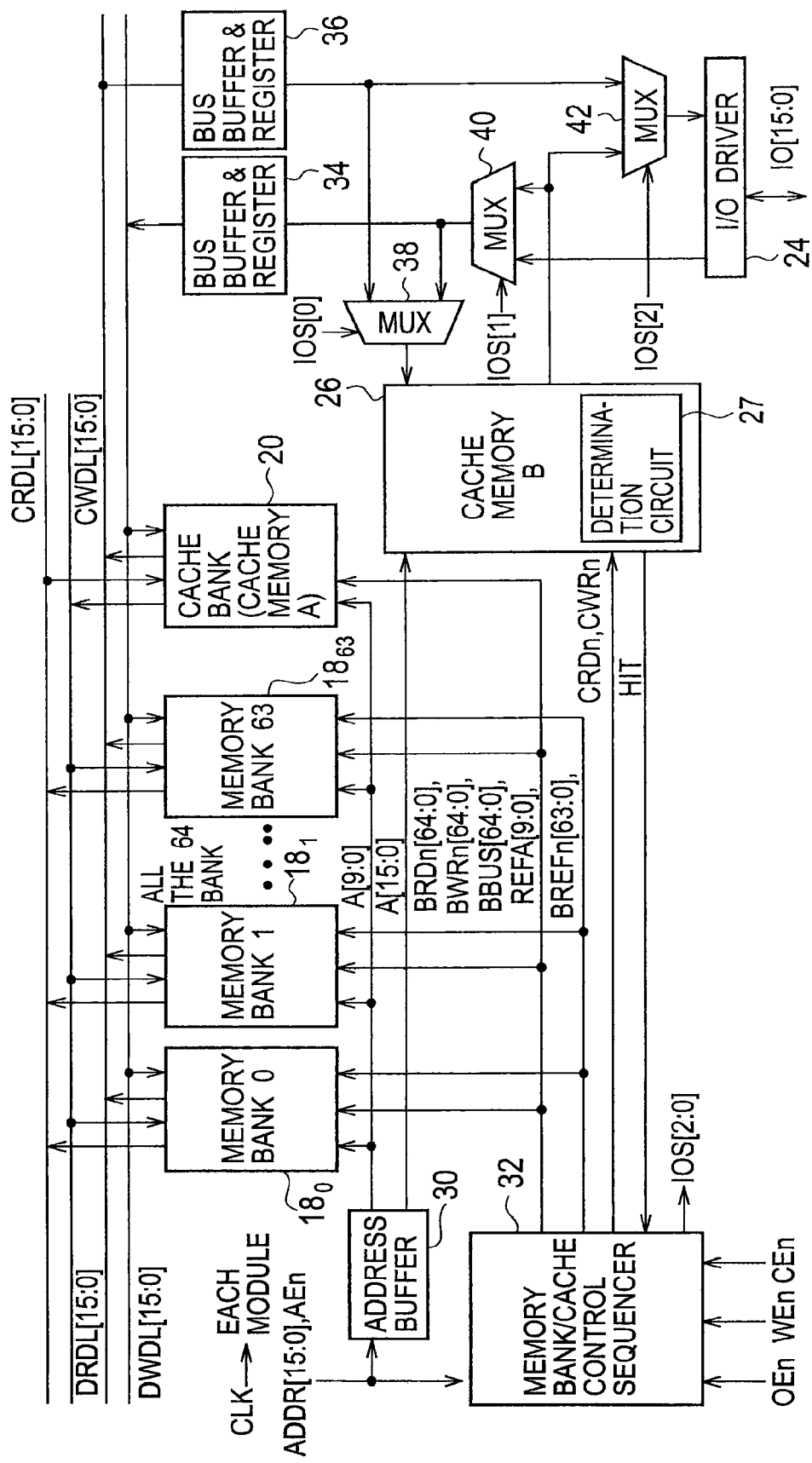
FIG. 4 is a schematic block configuration diagram of 1M bit FRAM as a specifically configuration example of the ferroelectric memory device according to the first embodiment of the present invention.

As a specifically configuration example of the ferroelectric memory device according to the first embodiment, as shown in FIG. 4, a schematic block configuration of the 1M bit FRAM includes: the plurality of memory banks $18_0$, $18_1$, ..., $18_{62}$, and $18_{63}$, and the cache bank 20; an address buffer 30; a memory bank/cache control sequencer 32; the cache memory B 26 having the determination circuit 27 for determining whether or not there is any target data; bus buffers & registers 34, 36, and the multiplexers 38, 40, 42; and the I/O control unit (I/O driver) 24. The clock signal CLK is supplied to each module.

The plurality of memory banks $18_0$, $18_1$, ..., $18_{62}$, and $18_{63}$ and the cache bank 20 are connected to the cache read-out signal line CRDL [15:0], the cache write-in signal line CWDL [15:0], the data read-out signal line DRDL [15:0], and the data write-in signal line DWDL [15:0].

The bus buffer & register 34 is connected to the data write-in signal line DWDL [15:0], and the bus buffer & register 36 is connected to the data read-out signal line DRDL [15:0].

The address signal ADDR [15:0] and the address enable signal AEn are inputted into the address buffer 30, and the memory bank/cache control sequencer 32.

Moreover, the output control signal OEn, the input control signal WEn, the memory effective signal CEn, and the cache hit signal HIT sent from the cache memory B 26 are inputted into the memory bank/cache control sequencer 32.

Moreover, the address signal A [9:0] is inputted into the plurality of memory banks $18_0$, $18_1$, ..., $18_{62}$, and $18_{63}$ and the cache bank 20 from the address buffer 30.

The memory bank read-out request signal BRDn [64:0], the memory bank write-in request signal BWRn [64:0], the bus select signal BBUS [64:0], and the refresh/copy selected address signal REFA are inputted to the plurality of memory banks $18_0, 18_1, \ldots, 18_{62}$, and $18_{63}$ and the cache bank 20 from a memory bank/cache control sequencer 32.

Moreover, the memory bank refresh request signal BREFn is supplied to the plurality of memory banks $18_0, 18_1, \ldots, 18_{62}$, and $18_{63}$ from the memory bank/cache control sequencer 32.

Furthermore, for example, the address signal A [15:0] is inputted into the cache memory B 26 composed of SRAM etc. from the address buffer 30, and the cache read-out request signal CRDn and the cache write-in request signal CWDn are inputted from the memory bank/cache control sequencer 32.

The multiplexers 38, 42 are connected to the bus buffer & register 36, and the multiplexers 38, 40 are connected to the bus buffer & register 34.

The output signal from the bus buffer & register 36 and the output signal from the cache memory B 26 are supplied to the multiplexer 42. The output signal from the multiplexer 42 is supplied to the I/O driver 24. The I/O driver 24 transmits and receives an input output data signal IO to an external circuit.

The output signal from the I/O driver 24 and the output signal from the cache memory B 26 are supplied to the multiplexer 40. The output signal from the multiplexer 40 is supplied to the multiplexer 38 and the bus buffer & register 36.

The output signal from the bus buffers & registers 34, 36 and the output signal from the multiplexer 40 are supplied to the multiplexer 38, and the output signal from the multiplexer 38 is supplied to the cache memory B 26.

The control signal IOS [2:0] is supplied to each multiplexer 38, 40, 42 from the memory bank/cache control sequencer 32.

In addition, the address buffer 30 and the memory bank/cache control sequencer 32 which are shown in FIG. 4 correspond to the buffer control circuit 28 shown in FIG. 1. Moreover, the bus buffers & registers 34, 36 and the multiplexers 38, 40, 42 which are shown in FIG. 4 correspond to the bus switching unit 22 shown in FIG. 1.

In this point, it is as follows when the meaning of each signal is explained. In addition, the signal with which n is attached to the last of the name of each signal is a signal of negative logic (low enabling).

The memory effective signal CEn is a signal for executing the data write-in and read-out to the ferroelectric memory device 10 at the timing of falling from high to low.

The address signal A is a signal for designating an address. In the first embodiment, for example, using 16-bit address signal ADDR, 6 bits is used for the bank designate, 1 bit is used for the block designate, 7 bits is used for the word designate, and 2 bits is used for selecting 16 bits of a bus from 64 bits/word.

The address enable signal AEn is a signal for deciding whether to treat address signal ADDR as an effective signal.

The input control signal WEn is a signal for deciding whether to execute the write-in to the ferroelectric memory device 10.

The output control signal OEn is a signal for deciding whether to execute the output from the ferroelectric memory device 10.

The address signal A inputted from an external of the ferroelectric memory device 10, the address enable signal AEn, the input control signal WEn, and the output control signal OEn are taken into the memory bank/cache control sequencer 32 in the falling timing of the memory effective signal CEn.

The cache hit signal HIT is turned to high at the time of the cache hit, and is turned to low at the time of the cache miss.

The cache read-out request signal CRDn is a signal for deciding whether to execute read-out from the cache memory B 26.

The cache write-in request signal CWRn is a signal for deciding whether to execute the write-in to the cache memory B 26.

The memory bank read-out request signal BRDn is a signal for deciding whether to execute read-out from the memory bank.

The memory bank write-in request signal BWRn is a signal for deciding whether to execute the write-in to the memory bank.

The bus select signal BBUS is a signal for switching the bus, and in more detail, is for selecting which bus the memory bank uses. According to the first embodiment, the cache read-out signal line CRDL and the cache write-in signal line CWDL are used when high level, and the data read-out signal line DRDL and the data write-in signal line DWDL are used when low level.

The memory bank refresh request signal BREFn is a refresh request signal to the target memory bank, and each memory bank is refreshed by applying this signal into a trigger.

These signals used inside the ferroelectric memory devices 10 are processed according to the clock signal CLK.

The input output data signal IO is an input output data signal to the ferroelectric memory device 10.

(Operation Timing Chart)

Figure 6:
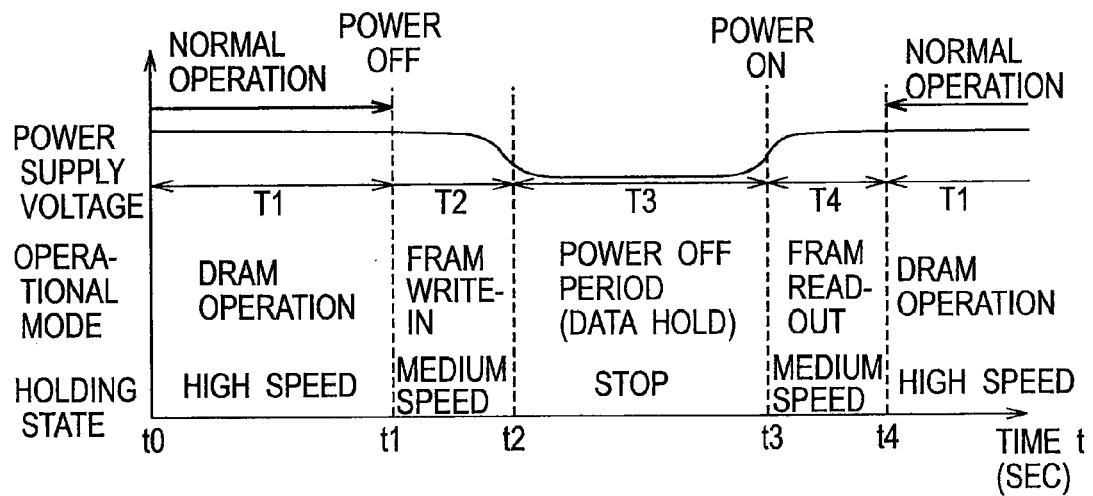
FIG. 6 is a timing chart for explaining a schematic of operation of the ferroelectric memory device according to the first embodiment of the present invention.

A schematic of operation of the ferroelectric memory device according to the first embodiment will be explained using a timing chart shown in FIG. 6.

(a) First of all, a period T1 of the timing t0 to t1 is in a normal operation state. As for the ferroelectric memory cell, polarization inversion is not occurred, and its variation $\Delta Q$ of the charge quantity at the time of random access is also small since it is a small capacity drive. Therefore, the high-speed operation by the DRAM operational mode is possible. The random access operation at the time of DRAM write-in and read-out of the holding state of data "1" and data "0" are executable at high speed.

(b) Next, the control signal of power OFF is received at the timing t1.

(c) Next, a period T2 of the timing t1 to t2 is in a FRAM write-in state. As for the ferroelectric memory cell, the polarization inversion is occurred, and its variation $\Delta Q$ of the charge quantity at the time of FRAM write-in is also large since it is a large capacity drive. Therefore, an operation of the medium speed by the FRAM write-in operational mode is possible.

(d) Next, a period T3 of the timing t2 to t3 is a power OFF period. The data "1" or "0" written by the FRAM write-in operational mode as quantity of electrical charges of residual polarization is held in the ferroelectric memory cell.

(e) Next, a period T4 of the timing t3 to t4 is in a FRAM read-out state. The data written by the polarization inversion is read by the FRAM read-out operation mode. In the case of read-out by this FRAM read-out operation mode, it is read from a polarization inversion state by large capacity drive. The variation $\Delta Q$ of the charge quantity at the time of FRAM read-out is also large. Therefore, an operation of the medium speed by the FRAM operational mode is possible during the period T4 of the timing t3 to t4.

(f) Next, a period T5 after the timing t4 is in a normal operation state. As for the ferroelectric memory cell, the polarization inversion is not occurred, and its variation $\Delta Q$ of charge quantity is also small since it is a small capacity drive. Therefore, the high-speed operation by the DRAM operational mode is possible. On the other hand, the ferroelectric memory cell can also be in the state of holding data also as quantity of electrical charges of residual polarization, not only as quantity of electrical charges charged up. In this case, the data is applied non-volatilizing, and the read-out by the DRAM operational mode is also possible.

In addition, although the above-mentioned operation explained with reference to FIG. 6 explains the configuration which executes the FRAM write-in after receiving the control signal of power OFF following the normal operation of T1, the present invention is not limited to this configuration. It may be made to execute the FRAM write-in, for example, in the case of refresh, instead of receiving the control signal of power OFF. By doing in this way, the necessity of executing the FRAM write-in after receiving the control signal of power OFF can be lessened, or necessity can be abolished. The FRAM write-in can be executed not only to this but to timing arbitrary besides this.

(DRAM Read-Out Operation)

Figure 7:
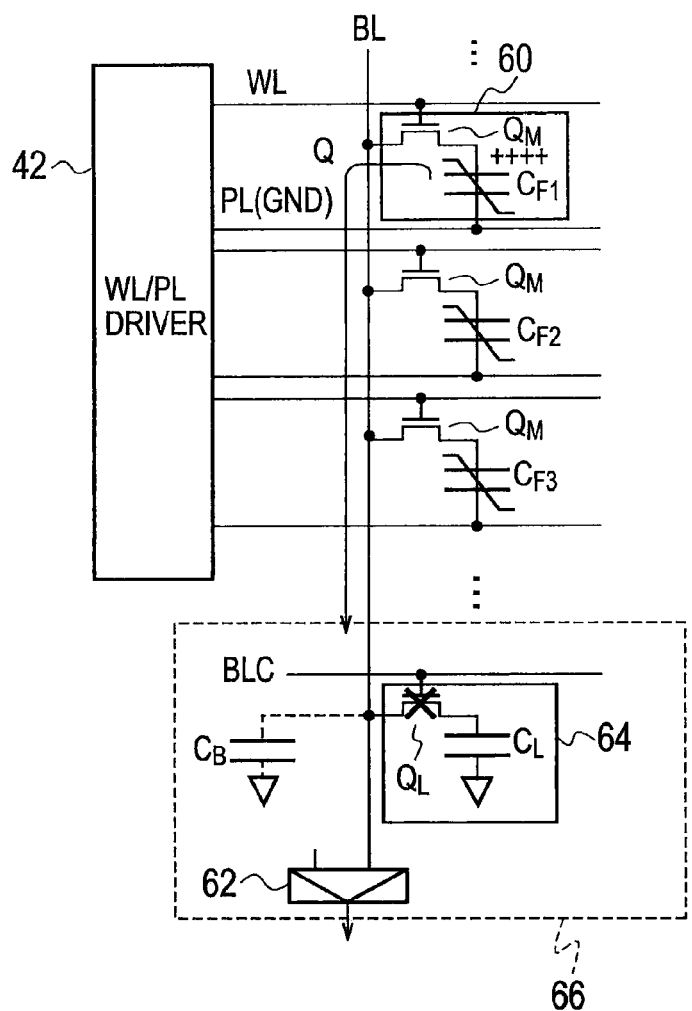
FIG. 7 is a circuit configuration chart for explaining a read-out operation of the ferroelectric memory cell at the time of normal operation (DRAM operational mode), in the ferroelectric memory device according to the first embodiment of the present invention.

In the ferroelectric memory device according to the first embodiment, the read-out operation of the ferroelectric memory cell at the time of normal operation (DRAM operational mode) will be explained with reference to a circuit configuration shown in FIG. 7.

The ferroelectric memory cell 60 connected on the same bit line BL includes memory cell transistors $Q_M$ and ferroelectric capacitors $C_{F1}$, $C_{F2}$, $C_{F3}$, . . . , respectively. The value of the ferroelectric capacitors $C_{F1}$, $C_{F2}$, $C_{F3}$, . . . is small when not occurring the polarization inversion state, and is large when occurring the polarization inversion state. That is, corresponding to the operating point on the hysteresis characteristic of the ferroelectric capacitor, although the read-out operation requires time (FRAM read-out mode) if it is made to operate during the operating point when the amount of variations of the electrical charges is large when occurring the polarization inversion state, the read-out operation is executed at high speed (DRAM read-out mode) if it is made to operate during the operating point when the amount of variations of the electrical charges is small.

In the DRAM read-out operation, a part with a small capacitor of the ferroelectric capacitor is used in the operating point on the hysteresis characteristic of the ferroelectric capacitor.

When the word line WL is turned to the high level in the condition that the plate line PL is applied into a ground level (GND), the electrical charge Q stored in the ferroelectric capacitor $C_{F1}$ is swept out on the bit line BL. At the time of the DRAM read-out operation, since the bit line capacitor control line BLC is turned to the low level, the load capacitor adjustment cell 64 in the load capacitor switching unit 66 does not work.

The electrical charge Q swept out on the bit line BL charges the bit line capacitor $C_B$, and the electrical change is amplified through the sense amplifier 62.

For example, in a ferroelectric memory device according to the first embodiment fabricated by the 0.35 micrometer CMOS technology, as a result of operating power supply voltage by 3.3V, the access time at the time of normal operation is about 9.8 ns. Since the access time at the time of the normal operation in the conventional FRAM is about 75 ns, in the ferroelectric memory device according to the first embodiment, the access time of the same grade as SRAM is obtained.

Figure 8:
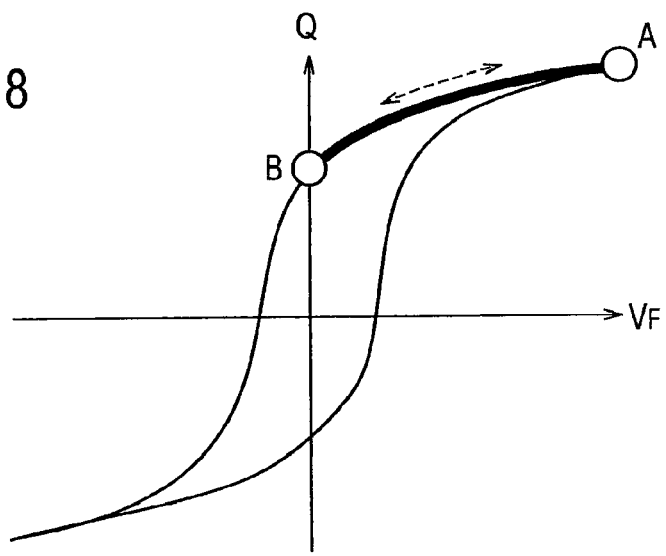
FIG. 8 is an operation explanatory diagram on the hysteresis characteristic for explaining the DRAM read-out operation of the ferroelectric memory cell at the time of the normal operation (DRAM operational mode) of the ferroelectric memory device according to the first embodiment of the present invention.

The DRAM read-out operation will be explained using the schematic circuit configuration chart showing in FIG. 7, and an operation explanatory diagram on the hysteresis characteristic shown in FIG. 8.

In the DRAM operational mode, by turning the bit line capacitor control line BLC into the low level, the load capacitor adjustment transistor $Q_L$ of the load capacitor adjustment cell 64 is in OFF state, and, as for the capacitance value of bit line BL, the state of the small capacity of $C_B$ is kept up. In this case, as shown in FIG. 8, the ferroelectric capacitor of the ferroelectric memory cell 60 is in the state of the operating points A and B on the hysteresis characteristic. That is, when "1" is stored, it is in the operating point A. On the other hand, when "0" is stored, it is in the operating point B. Amount of variations ΔQ of the electrical charge between the operating point A and the operating point B is small.

According to the charge conservation principle expressed by $\Delta Q = C_S \times V_S$, the voltage $V_B$ of the bit line BL is expressed by the following equation:

$$VB = \Delta Q/(C_S + C_B) = C_S \times V_S/(C_S + C_B)$$

where $C_S$ is a value of the ferroelectric capacitor $C_F$ in the DRAM operational mode, and $V_S$ is voltage stored in the ferroelectric capacitor $C_F$.

The voltage $V_B$ of the bit line BL is decided in the size of $C_S$ and $C_B$. The one where $C_B$ is smaller has large signal amplitude, and is suitable for high-speed operation.

(FRAM Read-Out Operation)

Figure 9:
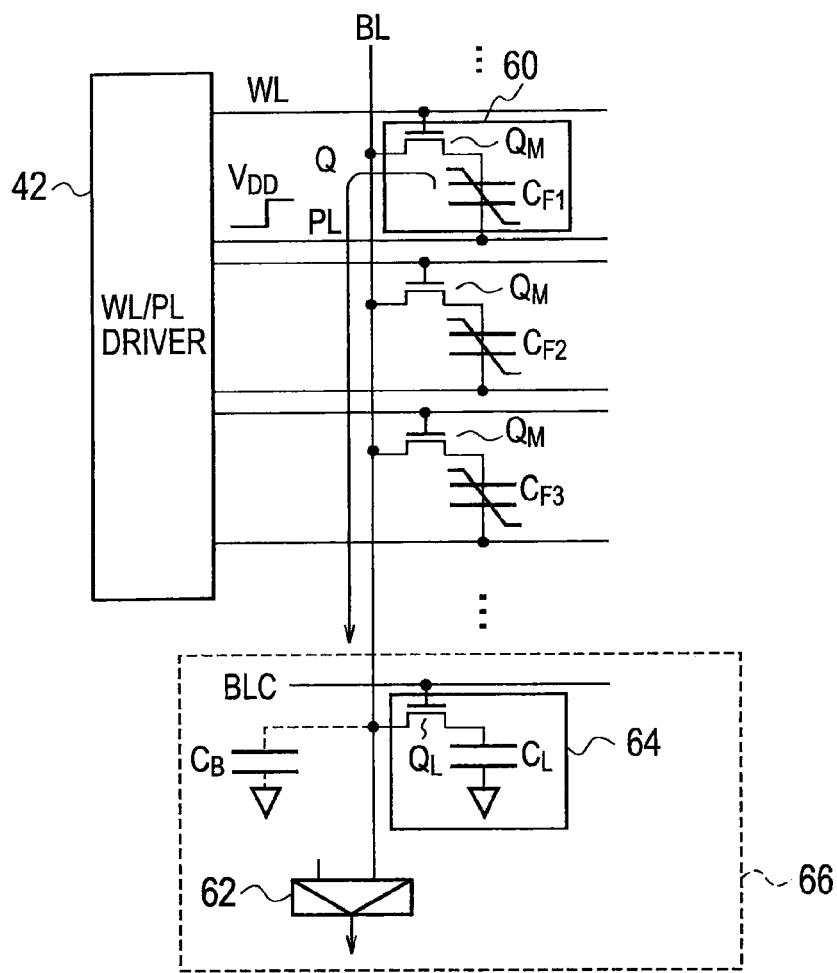
FIG. 9 shows an operation example of the ferroelectric memory device according to the first embodiment of the present invention, and is a circuit configuration chart for explaining an operation of the ferroelectric memory cell at the time of power ON operation (FRAM operational mode).

In the ferroelectric memory device according to the first embodiment, the read-out operation of the ferroelectric memory cell of the FRAM operational mode will be explained with reference to a circuit configuration shown in FIG. 9.

In the FRAM read-out operation, a part with a large capacity variation of the ferroelectric capacitor is used in the operating point on the hysteresis characteristic of the ferroelectric capacitor.

When the plate line PL is turned to the high level in the condition that the word line WL is turned to the high level, the electrical charge Q stored in the ferroelectric capacitor $C_{F1}$ is swept out on the bit line BL. Since the bit line capacitor control line BLC is turned to the high level in the FRAM read-out mode as for the load capacitor adjustment cell 64 in the load capacitor switching unit 66, the electrical charge Q swept out on the bit line BL charges the increased bit line capacitor $(C_B + C_L)$, and the electrical change is amplified through the sense amplifier 62.

According to the simulation result of the relation between the read-out voltage $V_{out}$ in the FRAM read-out mode, and the load capacitor $C_L$, the read-out voltage $V_{out}$ is about 0.40 v in the case where the bit line capacitor is only $C_B$ (DRAM read-out mode). On the other hand, when the load capacitor adjustment cell 64 is operated, the load capacitor $C_L$ is added, and the bit line capacitor is increased to $(C_B + C_L)$, the read-out voltage $V_{out}$ is set to about 0.63 v, and the signal quantity rises by about 1.5 times (FRAM read-out mode).

In the FRAM operational mode, the signal quantity of the read-out voltage $V_{out}$ is securable by adjusting the load capacitor $C_L$.

Figure 10:
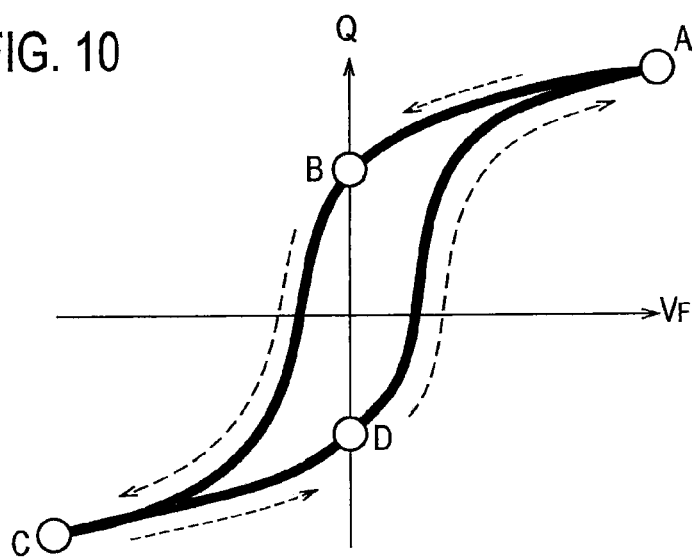
FIG. 10 is an operation explanatory diagram on the hysteresis characteristic for explaining an FRAM read-out operation of the ferroelectric memory cell of the FRAM operational mode of the ferroelectric memory device according to the first embodiment of the present invention.

The FRAM read-out operation will be explained using a schematic circuit configuration chart showing in FIG. 9, and an operation explanatory diagram on the hysteresis characteristic shown in FIG. 10.

In the FRAM read-out operation, by turning the bit line capacitor control line BLC to the high level, the load capacitor adjustment transistor $Q_L$ of the load capacitor adjustment cell 64 is in ON state, and the capacitance value of bit line BL is adjusted to the mass state of $(C_B + C_L)$. In this case, as shown in FIG. 10, the ferroelectric capacitor of the ferroelectric memory cell 60 is in the state of the operating points B and D on the hysteresis characteristic. That is, when "1" is stored, it is in the operating point B. On the other hand, when "0" is stored, it is in the operating point D. When the amount of variations of the electrical charge in the FRAM read-out operation of data "1" is expressed by $\Delta Q_L$ and the amount of variations of the electrical charge in the FRAM read-out operation of data "0" is expressed by $\Delta Q_S$, the amount of variations of the electrical charge between the operating point B and the operating point D ($\Delta Q_L - \Delta Q_S$) is large.

According to the charge conservation principle of $\Delta Q = C_S \times V_S$, when the voltage of the plate line PL rises from ground potential (GND) to $V_{DD}$, the following equation is satisfied:

$$\Delta Q = C_S \times V_S = C_B \times (V_{DD} - V_S)$$

where $C_S$ is a value of the ferroelectric capacitor $C_F$ in the FRAM read-out operation mode, and $V_S$ is voltage stored in the ferroelectric capacitor $C_F$. Therefore, the following equation is satisfied about the voltage $V_S$ stored in the ferroelectric capacitor $C_F$:

$$V_S = C_B \times V_{DD} / (C_S + C_B).$$

In this point, by being the load capacitor adjustment transistor $Q_L$ in ON state, and adjusting the capacitance value of the bit line BL to the large capacity state of $(C_B + C_L)$, the following equation is satisfied:

$$V_S = (C_B + C_L) \times V_{DD} / (C_S + C_B + C_L).$$

In the FRAM read-out operation mode, the read-out operation is executed by applying the voltage to the ferroelectric capacitor $C_F$ and considering the difference of output electrical charges. In order to apply sufficient voltage for the ferroelectric capacitor $C_F$, the great bit line capacitor $C_B$ is needed, and a great bit line capacitor is securable by being the load capacitor adjustment transistor $Q_L$ in ON state, and adjusting the capacitance value of the bit line BL to the large capacity state of $(C_B + C_L)$.

(Refresh Operation)

Figure 11:
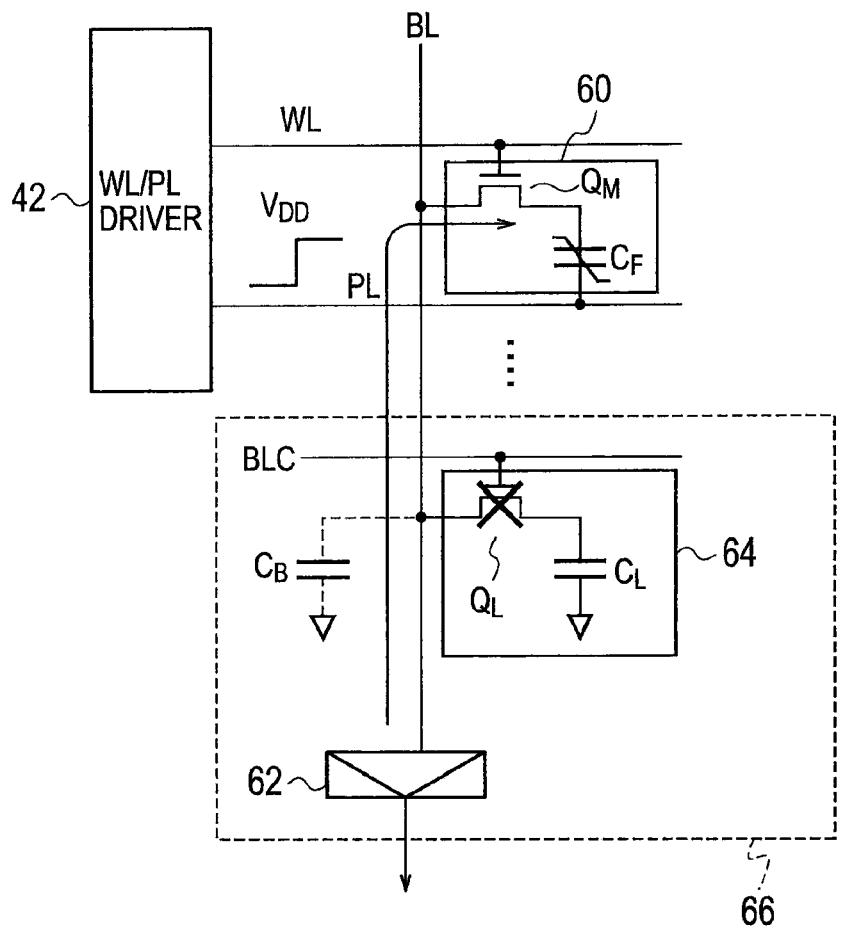
FIG. 11 shows an operation example of the ferroelectric memory device according to the first embodiment of the present invention, and is a circuit configuration chart for explaining an operation of the ferroelectric memory cell at the time of refresh operation.

In the ferroelectric memory device according to the first embodiment, the refresh operation of the ferroelectric memory cell will be explained using a circuit configuration shown in FIG. 11, and an operation waveform shown in FIG. 12A. Moreover, an operation on the hysteresis characteristic of the ferroelectric memory cell for holding data only with the quantity of electrical charges charged up is expressed as shown in FIG. 12B, an operation on the hysteresis characteristic at the time of the data write-in operation (FRAM operational mode) is expressed as shown in FIG. 12C and FIG. 12D, and an operation on the hysteresis characteristic for holding data by both quantity of electrical charges charged up and quantity of electrical charges of residual polarization is expressed as shown in FIG. 12E.

(a) First of all, a period T1 of the timing t0 to t1 indicates a data hold state. The storage state of data "1" is in the operating point A when $V_{DD}$ is applied, according to the hysteresis characteristic. On the other hand, the storage state of data "0" is in the operating point B when ground potential GND is applied, according to the hysteresis characteristic.

(b) Next, a period T2 of the timing t1 to t2 indicates the DRAM read-out operation. When high level voltage is applied to the word line WL in the condition that the potential of the plate line PL is a ground level, a minute electrical change occurs on the bit line BL, according to the storage state of the data "0" in the operating point B and the storage state of the data "1" in the operating point A, as shown in the period T1 of the timing t1 to t2, according to the hysteresis characteristic.

(c) Next, a period T3 of the timing t2 to t3 indicates the data write-in operation of the FRAM operational mode. When the high level voltage $V_{DD}$ is applied to the plate line PL in the condition that high level voltage is applied to the word line WL, as shown in FIG. 11, the state of data "1" is shifted to the operating point B of the GND level from the operating point A when the voltage $V_{DD}$ is applied. On the other hand, the state of data "0" is shifted from the operating point B of the GND level to the operating point C when negative voltage–$V_{DD}$ is applied. In the case of the shift to the operating point B, since it corresponds from the operating point A at the DRAM write mode, and the capacitor of the ferroelectric memory cell is small, the electrical change is small, its amount of variations of the electrical charges is also small, and high-speed operation is possible. On the other hand, in the case of the shift to the operating point C, since it corresponds from the operating point B at the FRAM write mode, and the capacitor of the ferroelectric memory cell is large, the electrical change is large, its amount of variations of the electrical charges is also large, and the data write-in requires considerable time.

(d) Next, a period T4 of the timing t3 to t4 also indicates the data write-in operation state of the FRAM operational mode. When the high level voltage $V_{DD}$ applied to the plate line PL is returned to the GND in the condition that the high level voltage is applied to the word line WL as shown in FIG. 12A, the state of data "1" is shifted from the operating point B of the GND level to the operating point A when the voltage $V_{DD}$ is applied as shown in FIG. 12D. On the other hand, the state of data "0" is shifted to the operating point D of the GND level from the operating point C when the negative voltage–$V_{DD}$ is applied. Since the capacitor of the ferroelectric memory cell is small in the case of the shift to the operating point A from the operating point B, the electrical change is small, its amount of variations of the electrical charges is also small, and high-speed operation is possible. On the other hand, since the capacitor of the ferroelectric memory cell is small also in the case of the shift to the operating point D from the operating point C, the electrical change is small, its amount of variations of the electrical charges is also small, and high-speed operation is possible.

(e) Next, a period T5 of the timing t4 to t5 indicates the data hold state. The storage states of data "1" are in the operating point A when the $V_{DD}$ is applied, according to the hysteresis characteristic of the ferroelectric memory cell. On the other hand, the storage states of data "0" are in the operating point D when the ground potential GND is applied, according to the hysteresis characteristic of the ferroelectric memory cell.

Thus, the period T1 of the timing t0 to t1 applies the data hold possible only with the quantity of electrical charges charged up. In contrast to it, the period T5 of the timing t4 to t5 applies the data hold possible by both the quantity of electrical charges charged up and the quantity of electrical charges of residual polarization. It is changing into the state of holding data also as the residual polarization, refreshing the data currently held as the quantity of electrical charges charged up.

(Operation Timing Chart of 1 Bank of Ferroelectric Memory Device)

Figure 13:
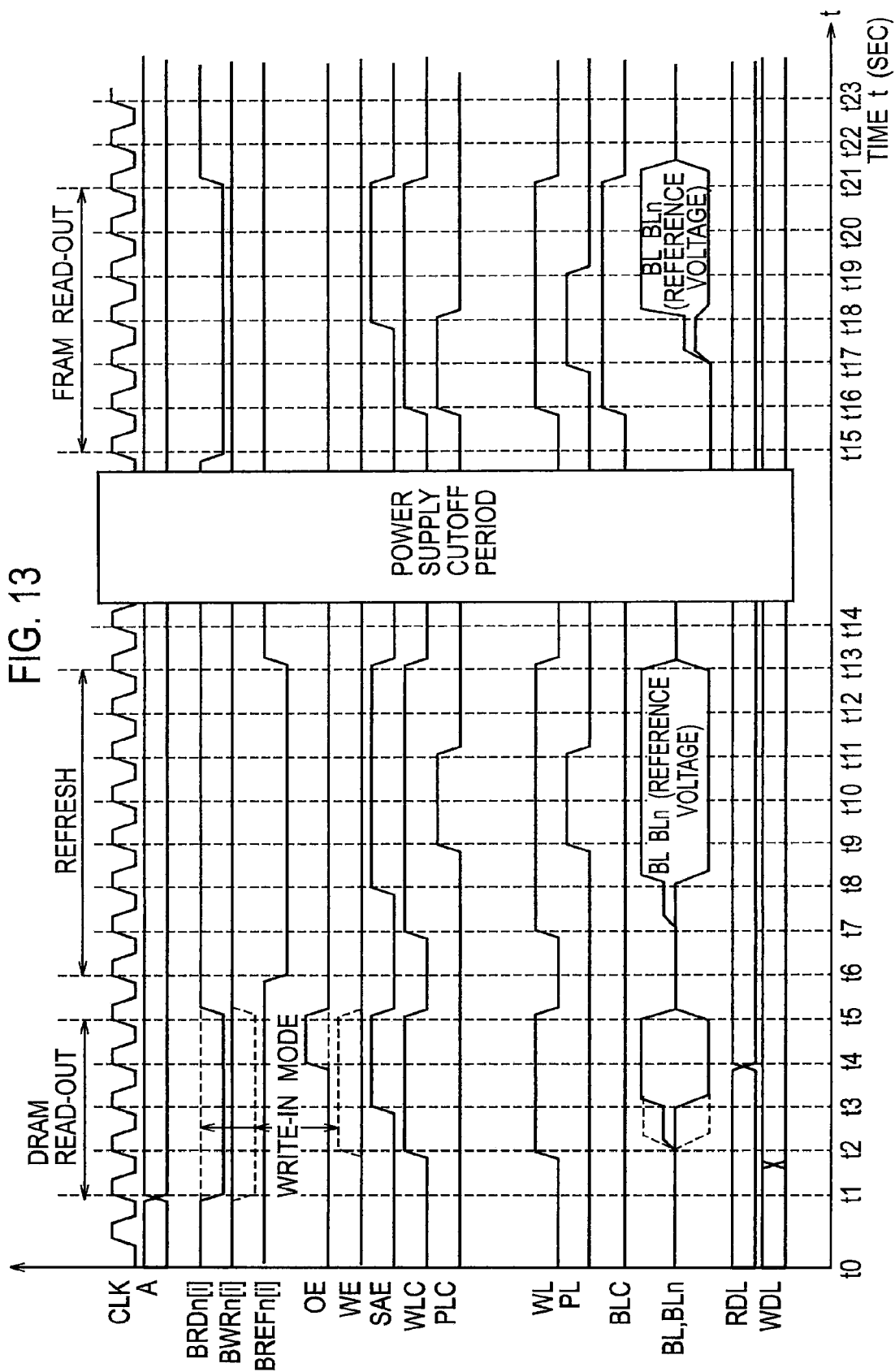
FIG. 13 is an operation timing chart of one memory bank of the ferroelectric memory device according to the first embodiment of the present invention.

As one memory bank of the ferroelectric memory device according to the first embodiment, an operation timing chart of the configuration example of the memory bank shown in FIG. 5 is expressed as shown in FIG. 13.

—Data Hold—

(a) First of all, a period of the timing t0 to t1 indicates the data hold state at the time of the normal operation. As shown in FIG. 12B, the storage state of data "1" is in the operating point A when $V_{DD}$ is applied, according to the hysteresis characteristic. On the other hand, the storage state of data "0" is in the operating point B when the ground potential GND is applied, according to the hysteresis characteristic of the ferroelectric memory cell.

—DRAM Read-Out Operation—

In the period of the timing t1 to t5, full lines show the data read-out operation of the DRAM operational mode.

(b) At the timing t1, the address signal A is supplied and the memory bank read-out request signal BRDn is turned to the low level. In this case, BRDn is displayed by negative logic (low enabling).

(c) Next, at the timing t2, the word line control signal WLC is turned ON, and the potential of the word line WL is turned to the high level. In this case, the potential of the plate line PL is the ground level, and a minute electrical change occurs in the bit lines BL and BLn as shown in the full line of the period of the timing t2 to t3, according to the storage state of the data "1" in the operating point A when the $V_{DD}$ is applied and the storage state of the data "0" in the operating point B when the ground potential GND is applied, by applying high level voltage to the word line WL, according to the hysteresis characteristic.

(d) Next, at the timing t3, when the sense amplifier control signal SAE is turned ON, the voltage level settles the potential of the bit lines BL and BLn by the sensing operation of the sense amplifier. The voltage which appears on the bit line BLn is reference voltage.

(e) Next, at the timing t4, when the output control signal OE is turned ON, the read-out data signal RDL is outputted from the I/O control unit 24 shown in FIG. 5.

—DRAM Writing Operation—

In the period of the timing t1 to t5, dashed lines show the data write-in operation of the DRAM operational mode.

(f) At the timing t1, the address signal A is supplied and the memory bank write-in request signal BWRn is turned to the low level simultaneously. In this case, BWRn is displayed by negative logic (low enabling).

(g) Next, at the timing t2, the input control signal WE is turned ON, and the word line control signal WLC is turned ON, and the potential of the word line WL turned to the high level. In this case, the potential of the plate line PL is the ground level, and it writes in with the potential generated on the bit lines BL and BLn according to the input signal from the outside as the DRAM writing operation by applying the high level voltage to the word line WL as the dashed lines of the period of the timing t2 to t3 shows.

(h) Next, at the timing t3, when the sense amplifier control signal SAE is turned ON, the potential of the bit lines BL and BLn is stabilized by the sensing operation of the sense amplifier.

—Data Refresh Operation of FRAM Operational Mode—

A period of the timing t6 to t13 shows the data refresh operation of the FRAM operational mode.

(i) At the timing t6, the memory bank refresh request signal BREFn is turned ON. In this case, BREFn is displayed by negative logic (low enabling).

(j) Next, at the timing t7, the word line control signal WLC is turned ON, and the potential of the word line WL is turned to the high level. In this case, the potential of the plate line PL is the ground level, and a minute electrical change occurs on bit lines BL and BLn by applying the high level voltage to the word line WL, as shown in the period of the timing t7 to t8.

(k) Next, at the timing t8, if sense amplifier control signal SAE is turned ON, the voltage level settles the potential of the bit lines BL and BLn by latchup operation of the sense amplifier. The voltage which appears on the bit line BLn is reference voltage.

(l) A period of the timing t9 to t11 shows the data write-in operation of the FRAM operational mode. As shown in FIG. 12C, when the high level voltage $V_{DD}$ is applied to the plate line PL in the condition that the high level voltage is applied to the word line WL, the state of data "1" is shifted to the operating point B of the GND level from the operating point A when the voltage $V_{DD}$ is applied. On the other hand, the state of data "0" is shifted from the operating point B of the GND level to the operating point C when the negative voltage $-V_{DD}$ is applied.

(m) Next, a period of the timing t11 to t13 also shows the data write-in operation of the FRAM operational mode. As shown in FIG. 12D, when the high level voltage $V_{DD}$ applied to the plate line PL is returned to GND in the condition that the high level voltage is applied to the word line WL, the state of data "1" is shifted from the operating point B of the GND level to the operating point A when the voltage $V_{DD}$ is applied. On the other hand, the state of data "0" is shifted to the operating point D of the GND level from the operating point C when the negative voltage $-V_{DD}$ is applied.

—Data Hold and Power Supply Cutoff Period—

A period of the timing t13 to t15 shows the data hold state. As shown in FIG. 12E, the storage state of data "1" is in the operating point A when $V_{DD}$ is applied, according to the hysteresis characteristic. On the other hand, the storage state of data "0" is in the operating point D when the ground potential GND is applied, according to the hysteresis characteristic. During the period which is powering ON among the timing t13 to t15, the data hold is applied possible by both the quantity of electrical charges charged up and the quantity of electrical charges of residual polarization. The data write-in operation is executed as residual polarization, refreshing data. In addition, a period of the timing t14 to t15 is equivalent to the power supply cutoff period.

—Data Read-Out Operation of FRAM Operational Mode—

A period of the timing t15 to t21 shows the data read-out operation of the FRAM operational mode.

(n) At the timing t15, the memory bank read-out request signal BRDn is turned to the low level.

(o) Next, at the timing t16, the word line control signal WLC is turned ON, the plate line control signal PLC is turned ON, and the potential of the word line WL is turned to the high level. Simultaneously, the bit line capacitor control signal BLCC (not shown) is turned ON, and the potential of the bit line capacitor control line BLC is turned to the high level. The load capacitor adjustment transistor $Q_L$ is turned ON and the capacitor of bit line BL becomes $C_B + C_L$ by applying the high level voltage to the bit line capacitor control line BLC in the condition that high level voltage is applied to the word line WL.

(p) Next, at the timing t17, when the potential of plate line PL is turned to the high level in the condition that high-level voltage is applied to the word line WL, a minute electrical change occurs on the bit lines BL and BLn, as shown in the period of the timing t17 to t18.

(q) Next, at the timing t18, when the sense amplifier control signal SAE is turned ON, the voltage level settles the potential of bit lines BL and BLn by latchup operation of the sense amplifier. The voltage which appears on the bit line BLn is reference voltage.

—Data Hold—

(r) A period after the timing t21 shows the data hold state at the time of the normal operation. The storage state of data "1" is in the operating point A when $V_{DD}$ is applied as well as the period of the timing t0 to t1, according to the hysteresis characteristic. On the other hand, the storage state of data "0"

is in the operating point B when the ground potential GND is applied, according to the hysteresis characteristic of the ferroelectric memory cell.

According to the first embodiment, it can be compatible in improvement in the speed by the BL capacitor reducible with the DRAM mode, and the BL capacitor securing in the FRAM mode by providing the load capacitor adjustment cell on the BL, and setting up the capacitor on the BL separately in the DRAM mode and the FRAM mode.

According to the first embodiment, it can be made to operate by the DRAM operational mode with small capacitor load for high-speed operation at the time of the normal operation, and can be made to operate by the FRAM operational mode for the data hold of the power OFF period at the time of power ON/OFF.

According to the first embodiment, since the load capacitor adjustment cell can be composed from same structure as the ferroelectric memory cell for data holds and it connects with BL through the access transistor only at the time of the FRAM mode, the configuration can be simplified.

According to the first embodiment, in order to shorten the time of the data restoring (FRAM mode write-in) which is occurred at the time of the power supply cutoff, in the refresh cycle at the time of the normal operation (DRAM mode), since the target ferroelectric memory cell is in the data hold state in not only the quantity of electrical charges charged up but the quantity of electrical charges of residual polarization, the data is non-volatilizing and read-out by the DRAM mode is also possible. In this case, if the refresh cycle is considered into 10 ms, for example, the number of times of the polarization inversion per 1 second is $10^2$ times. Therefore, since the endurance for three years is about $10^8$ seconds, even if it performs polarization inversion at the time of refresh, it is satisfactory in endurance.

Moreover, according to the first embodiment, although the ferroelectric memory cell is in the state of holding data only with the quantity of electrical charges charged up when the DRAM mode read-out/write-in is executed for the ferroelectric memory cell after the refresh cycle, since it tends to concentrate the data access part into the ferroelectric memory device on a local portion and the probability that the DRAM mode read-out is applied to after the refresh cycle is low, the ferroelectric memory cell which actually executes the data restoring at the time of power supply cutoff can be limited only to a local portion, and can achieve large improvement in the speed as compared with all the ferroelectric memory cell data restoration.

Therefore, according to the first embodiment, improvement in the speed of operating speed of the same grade as SRAM can achieve.

Moreover, according to the first embodiment, improvement in the speed of the data restoring process at the time of the power supply cutoff can be achieved.

Moreover, according to the first embodiment, as compared with FRAM which performs the polarization inversion each time, the number of times of polarization inversion can be reduced, and the characteristic degradation of the ferroelectric device can be suppressed.

(Operation Timing Chart of Plurality of Banks)

Figure 14:
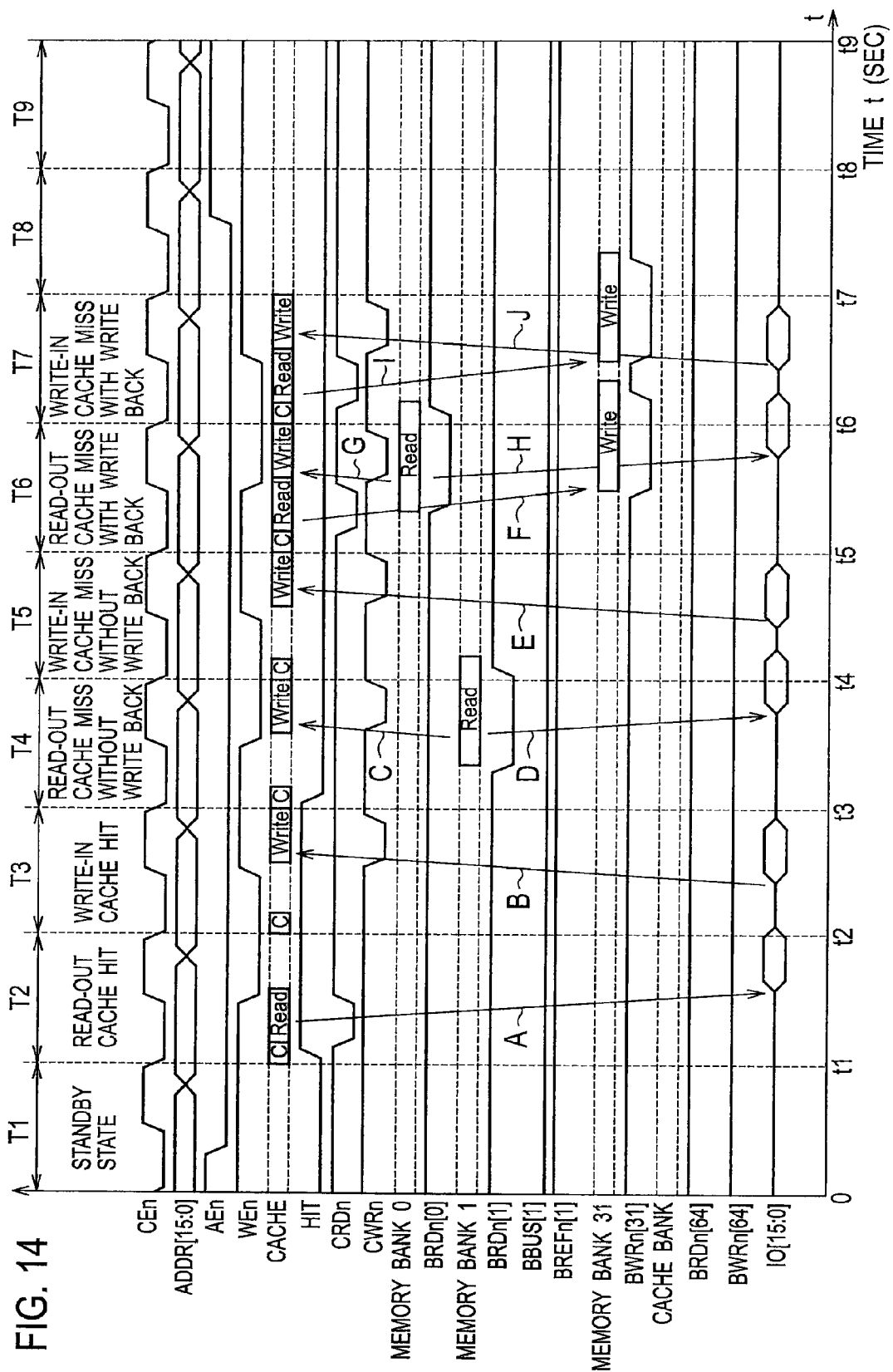
FIG. 14 is an operation timing chart of a plurality of memory banks at the time of the normal operation of the ferroelectric memory device according to the first embodiment of the present invention.

An operation timing chart of a plurality of banks at the time of the normal operation of the ferroelectric memory device according to the first embodiment is expressed as shown in FIG. 14. First of all, in FIG. 14, it will explain the normal operation which does not use the cache bank 20.

—Normal Operation—

In FIG. 14, the standby state in a period T1, the read-out cache hit state in a period T2, the write-in cache hit state in a period T3, the read-out cache miss state without write back in a period T4, the write-in cache miss state without write back in a period T5, the read-out cache miss state with write back in a period T6, and the write-in cache miss state with write back in a period T7 are shown. Each period of T1 to T7 is equivalent to one cycle period of the memory cycle. In addition, as for the clock signal CLK, since the period of rising and falling is dramatically short and it is hard to display on the scale of FIG. 14, the clock signal CLK shown in FIG. 4 etc. is not shown.

(a) First of all, the period T1 of timing 0 to t1 shows the standby state. From the shift from the high level to the low level of the memory effective signal CEn (falling timing) to the next falling timing corresponds to the period T1. The address signal ADDR [15:0] is given as illustration. The address enable signal AEn shifts to the low level from the high level. In this case, since the address enable signal AEn is composed of negative logic, the address signal ADDR is treated as an effective signal at the time of the low level. The input control signal WEn is in the high level. That is, at the timing 0, the address enable signal AEn and the input control signal WEn which are the negative logic are in the high level. The cache hit signal HIT is in the low level. Each the cache read-out request signal CRDn, the cache write-in request signal CWRn, the memory bank read-out request signals BRDn [0], BRDn [1], and BRDn [64], the bus select signal BBUS [1], the memory bank refresh request signal BREFn [1], and the memory bank write-in request signals BWRn [31] and BWRn are in the high level.

(b) The period T2 of the timing t1 to t2 shows the read-out cache hit state. Since the input control signal WEn is in the high level at the timing t1, the write-in to the ferroelectric memory device 10 is not executed during the period T2. At the timing t1, as shown in the "cache" column of FIG. 14 by "C", the existence or nonexistence of a cache hit are distinguished and the cache hit signal HIT shifts to the high level from the low level. Afterward, when the cache read-out request signal CRDn shifts to the low level from the high level, data is read from the cache memory B 26, and the output data signals is outputted from the I/O driver 24 (Read), as shown by the arrow A. The cache read-out request signal CRDn shifts to the high level from the low level after a predetermined pulse period.

(c) The period T3 of the timing t2 to t3 shows the write-in cache hit state. Since the input control signal WEn is in the low level at the timing t2, the write-in to the ferroelectric memory device 10 is executed during the period T3. In the period T3, when the cache write-in request signal CWRn shifts from the high level to the low level, the input data signal is written in the cache memory B26 from the I/O driver 24 (Write), as shown by the arrow B. The cache write-in request signal CWRn shifts to the high level from the low level after a predetermined pulse period.

(d) The period T4 of the timing t3 to t4 shows the read-out cache miss state without write back. In this case, an example when desired data is stored in the memory bank 1 is shown. Since the input control signal WEn is in the high level at the timing t3, the write-in to the ferroelectric memory device 10 is not executed during the period T4. At the timing t3, when the cache hit signal HIT shifts from the high level to the low level, and then the memory bank read-out request signal BRDn [1] shifts to the low level from the high level, the data of the memory bank 1 is read and the output data signal is outputted from the I/O driver 24 through the bus buffer & register 36 and the multiplexer 42 (Read), as shown by the arrow D. Moreover, since the cache write-in request signal CWRn shifts to the low level from the high level, the data stored in the memory bank 1 is read, and is written in the cache memory B 26 through the bus buffer & register 36 and the multiplexer 38 (Write), as shown by the arrow C.

(e) The period T5 of the timing t4 to t5 shows the write-in cache miss state without write back. The cache hit signal HIT is in the low level. Since the input control signal WEn is in the low level at the timing t4, the write-in to the ferroelectric memory device 10 is executed during the period T5. In the period T5, since the cache write-in request signal CWRn shifts to the low level from the high level, the input data signal is written in the cache memory B 26 from the I/O driver 24 (Write), as shown by the arrow E. In the case of the period T5 which does not execute write back even if it is the write-in cache miss, passage of each signal becomes with the timing passage same as the period T3 executed the write-in cache hit.

(f) The period T6 of the timing t5 to t6 shows the read-out cache miss state with write back. The cache hit signal HIT is in the low level. In the period T6, the cache read-out request signal CRDn shifts to the low level from the high level, and the memory bank write-in request signal BWRn [31] shifts to the low level from the high level, and then the data stored in the cache memory B 26 is read (Read), and is written back to the memory bank 31 through the multiplexer 40 and the bus buffer & register 34 (Write), as shown by the arrow F. The cache read-out request signal CRDn shifts to the high level from the low level after a predetermined pulse period, and the memory bank write-in request signal BWRn [31] shifts to the high level from the low level. The memory bank read-out request signal BRDn [0] shifts to the low level from the high level, and the data stored in the memory bank 0 is read and the output data signal is outputted from the I/O driver 24 through the bus buffer & register 36 and the multiplexer 42 (Read) as shown by the arrow H. Moreover, the cache write-in request signal CWRn shifts from the high level to the low level, and the data stored in the memory bank 0 is read (Read) and written in the cache memory B26 through the bus buffer & register 36 and the multiplexer 38 (Write), as shown by the arrow G. The cache write-in request signal CWRn shifts to high level from the low level after a predetermined pulse period.

As mentioned above, since the write back is executed first of all, the data stored in the cache memory B 26 is read, is buffered to the bus buffer & register 34, and is written in the memory bank 31. Moreover, the data read from the memory bank 0 is written in the cache memory B 26 through the bus buffer & register 36. Thus, since the different bus buffers & registers 34, 36 is used properly, it is possible to start the write-in from the memory bank 0 to the cache memory B 26 before the write back to the memory bank 31 finishes.

(g) The period T7 of the timing t6 to t7 shows the write-in cache miss state with write back. The cache hit signal HIT is in the low level. Since the input control signal WEn is in the low level at the timing t6, the write-in to the ferroelectric memory device 10 is executed during the period T7. In the period T7, when the cache read-out request signal CRDn shifts to the low level from the high level and the memory bank write-in request signal BWRn [31] shifts to the low level from the high level, the data of the cache memory B 26 is read (Read), and is written back to the memory bank 31 through the multiplexer 40 and the bus buffer & register 34 (Write), as shown by the arrow I. The cache read-out request signal CRDn shifts to the high level from the low level after a predetermined pulse period. Moreover, as shown by the arrow J, the input data signal is written in the cache memory B 26 from the I/O driver 24 (Write).

Figure 15:
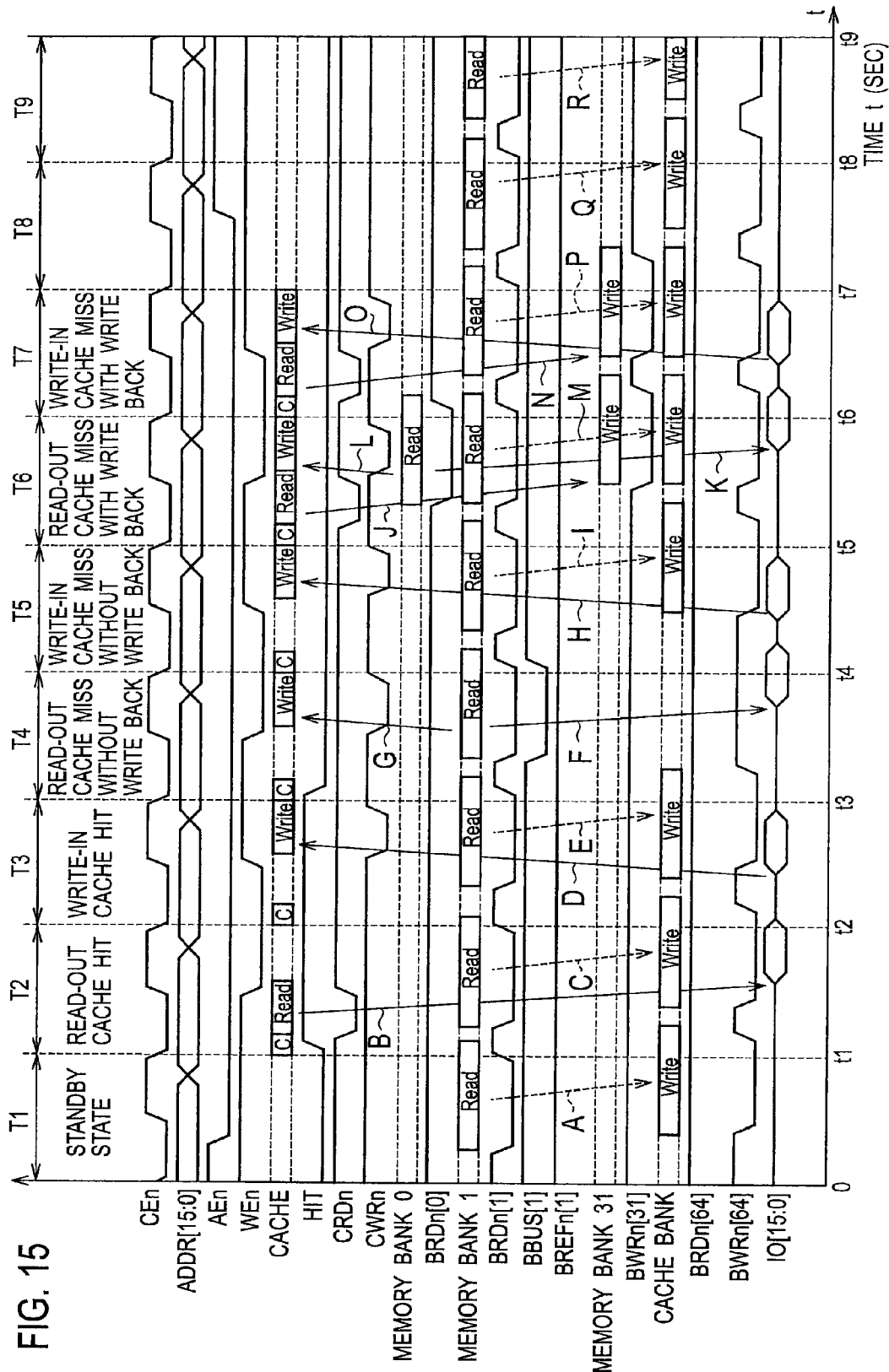
FIG. 15 is an operation timing chart of a plurality of memory banks at the time of the data copy operation to the cache bank of the ferroelectric memory device according to the first embodiment of the present invention.

The operation timing chart of a plurality of banks at the time of the data copy operation to the cache bank of the ferroelectric memory device according to the first embodiment is expressed as shown in FIG. 15. More specifically, it is an operation timing showing the operation at the time of having copied the data of the memory bank 1 to the cache bank 20 beforehand in order to refresh in the memory bank 1 as an example.

—Data Copy Operation to Cache Bank—

Also in FIG. 15, the standby state in a period T1, the read-out cache hit state in a period T2, the write-in cache hit state in a period T3, the read-out cache miss state without write back in a period T4, the write-in cache miss state without write back in a period T5, the read-out cache miss state with write back in a period T6, and the write-in cache miss state with write back in a period T7 are shown as well as FIG. 14.

(a) First of all, the period T1 of timing 0 to t1 shows the standby state. From the falling timing 0 of the memory effective signal CEn to the next falling timing t1 corresponds to the period T1. The address signal ADDR [15:0] is given as illustration. The cache hit signal HIT is in the low level. Each the input control signal WEn, the cache read-out request signal CRDn, the cache write-in request signal CWRn, the memory bank read-out request signals BRDn [0] and BRDn[64], the bus select signal BBUS [1], the memory bank refresh request signal BREFn [1], the memory bank write-in request signal BWRn [31], and memory bank read-out request signal BRDn [64] are in the high level.

In this case, when the memory bank read-out request signal BRDn [1] shifts to the low level from the high level and the memory bank write-in request signal BWRn [64] shifts to the low level from the high level, the data stored in the memory bank 1 is read (Read), and is written in the cache bank 20 composed of the cache memory A through the cache read-out signal line CRDL [15:0]. As a result, as shown by the arrow A, the data copy to the cache bank 20 is executed.

(b) The period T2 of the timing t1 to t2 shows the read-out cache hit state. At the timing t1, as shown in the "cache" column of FIG. 15 by "C", the existence or nonexistence of a cache hit are distinguished and the cache hit signal HIT shifts to the high level from the low level, and then when the cache read-out request signal CRDn shifts to the low level from the high level, data is read from the cache memory B 26, and the output data signals is outputted from the I/O driver 24 through the multiplexer 42 (Read), as shown by the arrow A. The cache read-out request signal CRDn shifts to the high level from the low level after a predetermined pulse period. In this case, in the period T2, when the memory bank read-out request signal BRDn [1] shifts from the high level to the low level and the memory bank write-in request signal BWRn [64] shifts to the low level from the high level, the data stored in the memory bank 1 is read (Read), and is written in the cache bank 20 composed of the cache memory A through the cache read-out signal line CRDL [15:0]. As a result, as shown by the arrow C, the data copy to the cache bank 20 is executed. The memory bank read-out request signal BRDn [1] and the memory bank write-in request signal BWRn [64] shift to high level from the low level after passage of a predetermined pulse period.

(c) The period T3 of the timing t2 to t3 shows the write-in cache hit state. The cache hit signal HIT is in the high level. When the cache write-in request signal CWRn shifts from the high level to the low level after the timing t2, as shown by the arrow D, the input data signal is written in the cache memory B 26 from the I/O driver 24 (Write). Moreover, when the memory bank read-out request signal BRDn [1] shifts from the high level to the low level and the memory bank write-in request signal BWRn [64] shifts to the low level from the high level after the timing t2, the data stored in the memory bank 1 is read (Read), and is written in the cache bank 20 composed of the cache memory A through the cache read-out signal line CRDL [15:0]. As a result, as shown by the arrow E, the data copy to the cache bank 20 is executed.

(d) The period T4 of the timing t3 to t4 shows the read-out cache miss state without write back. At the timing t3, the cache hit signal HIT shifts from the high level to the low level. In the period T4, when the memory bank read-out request signal BRDn [1] shifts from the high level to the low level, the data stored in the memory bank 1 is read and the output data signal is outputted from the I/O driver 24 (Read), as shown by the arrow F. In addition, since the bus select signal BBUS [1] shifts to the low level from the high level, the bus line is switched to the data read-out signal line DRDL from the memory bank 1, and the data is outputted to the I/O driver 24 through the bus buffer & register 36 and the multiplexer 42. Moreover, when the cache write-in request signal CWRn shifts to the low level from the high level, the data stored in the memory bank 1 is read, and is written in the cache memory B 26 through the bus buffer & register 36 and the multiplexer 38 (Write), as shown by the arrow G.

(e) The period T5 of the timing t4 to t5 shows the write-in cache miss state without write back. The cache hit signal HIT is in the low level. When the cache write-in request signal CWRn shifts to the low level from the high level, the input data signal is written in the cache memory B 26 from the I/O driver 24 (Write), as shown by the arrow H. Moreover, when the memory bank read-out request signal BRDn [1] shifts to the low level from the high level, the data stored in the memory bank 1 is read through the cache read-out signal line CRDL [15:0], and is written in the cache bank 20 composed of the cache memory A (Write). As a result, as shown by the arrow I, the data copy to the cache bank 20 is executed. The memory bank read-out request signal BRDn [1] shifts to the high level from the low level after predetermined lapse of period.

(f) The period T6 of the timing t5 to t6 shows the read-out cache miss state with write back. The cache hit signal HIT is in the low level. In the period T6, when the cache read-out request signal CRDn shifts to the low level from the high level and the memory bank write-in request signal BWRn [31] shifts to the low level from the high level, the data stored in the cache memory B 26 is read (Read), and is written back to the memory bank 31 through the multiplexer 40 and the bus buffer & register 34 in order to execute the write back (Write), as shown by the arrow J.

Moreover, when the memory bank read-out request signal BRDn [0] shifts to the low level from the high level and the cache write-in request signal CWRn shifts from the high level to the low level, the data stored in the memory bank 0 is read (Read) and is written in the cache memory B26 through the bus buffer & register 36 and the multiplexer 38 (Write), as shown by the arrow L. Simultaneously, as shown by the arrow K, the data stored in the memory bank 0 is read and the output data signal is outputted from the I/O driver 24 through the bus buffer & register 36 and the multiplexer 42 (Read).

On the other hand, when the memory bank read-out request signal BRDn [1] shifts from the high level to the low level and the memory bank write-in request signal BWRn [64] shifts to the low level from the high level, the data stored in the memory bank 1 is read and is written in the cache bank 20 composed of the cache memory A through the cache read-out signal line CRDL [15:0] (Write). As a result, as shown by the arrow M, the data copy to the cache bank 20 is executed.

(g) The period T7 of the timing t6 to t7 shows the write-in cache miss state with write back. The cache hit signal HIT is in the low level.

In the period T7, when the cache read-out request signal CRDn shifts to the low level from the high level and the memory bank write-in request signal BWRn [31] shifts to the low level from the high level, the data stored in the cache memory B 26 is read (Read), and is written back to the memory bank 31 through the multiplexer 40 and the bus buffer & register 34 in order to execute write back (Write), as shown by the arrow N.

Moreover, as shown by the arrow O, when the cache write-in request signal CWRn shifts from the high level to the low level, the input data signal is written in the cache memory B 26 from the I/O driver 24 (Write).

On the other hand, when the memory bank read-out request signal BRDn [1] shifts from the high level to the low level and the memory bank write-in request signal BWRn [64] shifts to the low level from the high level, the data stored in the memory bank 1 is read and is written in the cache bank 20 composed of the cache memory A through the cache read-out signal line CRDL [15:0] (Write). As a result, as shown by the arrow P, the data copy to the cache bank 20 is executed.

(h) In the operation of the period T8 of the timing t7 to t8 and the period T9 of the timing t8 to t9, the memory bank read-out request signal BRDn [1] shifts from the high level to the low level, the data stored in the memory bank 1 is read (Read), and is written in the cache bank 20 composed of the cache memory A through the cache read-out signal line CRDL [15:0] when the memory bank write-in request signal BWRn [64] shifts to the low level from high level, as well as the operation in the period T1. As a result, as shown by the arrows Q and R, the data copy to the cache bank 20 is executed.

Figure 16:
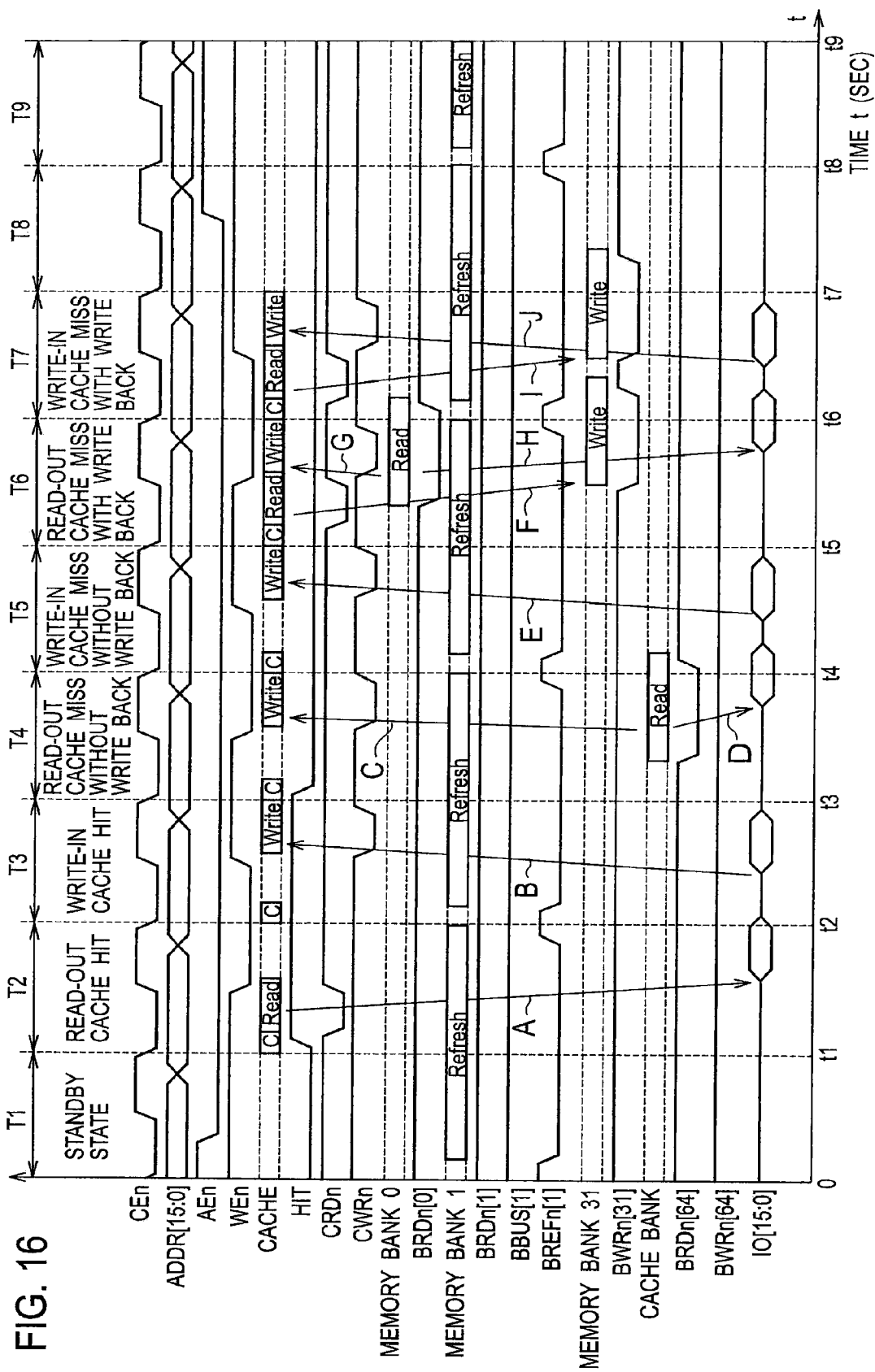
FIG. 16 is an operation timing chart of a plurality of memory banks at the time of the refresh operation of the ferroelectric memory device according to the first embodiment of the present invention.

An operation timing chart of a plurality of memory banks at the time of the refresh operation of the ferroelectric memory device according to the first embodiment is expressed as shown in FIG. 16. More specifically, after the copy from the memory bank 1 to the cache bank 20 explained with reference to FIG. 15 is completed, an operation at the time of actually refreshing by the memory bank 1 will be explained.

—Refresh Operation—

Also in FIG. 16, the standby state in a period T1, the read-out cache hit state in a period T2, the write-in cache hit state in a period T3, the read-out cache miss state without write back in a period T4, the write-in cache miss state without write back in a period T5, the read-out cache miss state with write back in a period T6, and the write-in cache miss state with write back in a period T7 are shown.

In this case, it is as follows when the difference between the normal operation explained in FIG. 14 and the operation at the time of the refresh in FIG. 16 is explained briefly. That is, in the memory bank 1, the refresh operation is executed according to the memory bank refresh request signal BREFn [1]. During the above operation, when access to the memory bank 1 during the refresh is needed for the cache miss or write back, the access is executed instead to the cache bank 20 whose data is already copied. In the ferroelectric memory device 10, other operations are the same as that explained in FIG. 14, and the normal operation without refresh penalty is possible.

Hereinafter, the operation of FIG. 16 will be explained.

As shown in FIG. 16, the refresh operation of the ferroelectric memory device according to the first embodiment is executed over the two cycles of period T1 and period T2, the two cycles of period T3 and period T4, the two cycles of period T5 and period T6, and the two cycles of period T7 and period T8.

(a) First of all, the period T1 of timing 0 to t1 shows the standby state. From the shift from the high level to the low level of the memory effective signal CEn (falling timing) to the next falling timing corresponds to the period T1. The address signal ADDR [15:0] is given as illustration. The address enable signal AEn shifts to the low level from the high level. The input control signal WEn is in the high level. That is, at the timing 0, the address enable signal AEn and the input control signal WEn which are the negative logic are in the high level. The cache hit signal HIT is in the low level. Each the cache read-out request signal CRDn, the cache write-in request signal CWRn, the memory bank read-out request signals BRDn [0], BRDn [1], and BRDn[64], the bus select signal BBUS [1], the memory bank refresh request signal BREFn [1], and the memory bank write-in request signals BWRn [31] and BWRn are in the high level. When the memory bank refresh request signal BREFn [1] shifts to the low level from the high level, the refresh in the memory bank 1 is executed (Refresh).

(b) The period T2 of the timing t1 to t2 shows the read-out cache hit state. Since the input control signal WEn is in the high level at the timing t1, the write-in to the ferroelectric memory device 10 is not executed during the period T2. At the timing t1, as shown in the "cache" column of FIG. 16 by "C", the existence or nonexistence of a cache hit are distinguished and the cache hit signal HIT shifts to the high level from the low level. Afterward, when the cache read-out request signal CRDn shifts to the low level from the high level, data is read from the cache memory B 26, and the output data signals is outputted from the I/O driver 24 (Read), as shown by the arrow A. The cache read-out request signal CRDn shifts to the high level from the low level after a predetermined pulse period. As for the memory bank refresh request signal BREFn [1], since the low level is kept up, the refresh in the memory bank 1 is executed continuously (Refresh).

(c) The period T3 of the timing t2 to t3 shows the write-in cache hit state. Since the input control signal WEn is in the low level at the timing t2, the write-in to the ferroelectric memory device 10 is executed during the period T3. In the period T3, when the cache write-in request signal CWRn shifts from the high level to the low level, the input data signal is written in the cache memory B26 from the I/O driver 24 (Write), as shown by the arrow B. The cache write-in request signal CWRn shifts to the high level from the low level after a predetermined pulse period. Since the memory bank refresh request signal BREFn [1] shifts to the low level again near the timing t2, after shifting to high level during a predetermined period, the refresh in the memory bank 1 is executed (Refresh).

(d) The period T4 of the timing t3 to t4 shows the read-out cache miss state without write back. In this case, an example when desired data is stored in the cache bank 20 is shown. Since the input control signal WEn is in the high level at the timing t3, the write-in to the ferroelectric memory device 10 is not executed during the period T4. At the timing t3, when the cache hit signal HIT shifts from the high level to the low level, and then the memory bank read-out request signal BRDn [64] shifts to the low level from the high level, the data of the cache bank 20 is read and the output data signal is outputted from the I/O driver 24 through the bus buffer & register 36 and the multiplexer 42 (Read), as shown by the arrow D. Moreover, since the cache write-in request signal CWRn shifts to the low level from the high level, the data stored in the cache bank 20 is read, and is written in the cache memory B 26 through the bus buffer & register 36 and the multiplexer 38 (Write), as shown by the arrow C. As for the memory bank refresh request signal BREFn [1], since the low level is kept up, the refresh in the memory bank 1 is executed continuously (Refresh).

(e) The period T5 of the timing t4 to t5 shows the write-in cache miss state without write back. The cache hit signal HIT is in the low level. Since the input control signal WEn is in the low level at the timing t4, the write-in to the ferroelectric memory device 10 is executed during the period T5. In the period T5, since the cache write-in request signal CWRn shifts to the low level from the high level, the input data signal is written in the cache memory B 26 from the I/O driver 24 (Write), as shown by the arrow E. In the case of the period T5 which does not execute write back even if it is the write-in cache miss, passage of each signal becomes with the timing passage same as the period T3 executed the write-in cache hit. Since the memory bank refresh request signal BREFn [1] shifts to the low level again near the timing t4, after shifting to the high level during predetermined period, the refresh in the memory bank 1 is executed (Refresh).

(f) The period T6 of the timing t5 to t6 shows the read-out cache miss state with write back. The cache hit signal HIT is in the low level. In the period T6, the cache read-out request signal CRDn shifts to the low level from the high level, and the memory bank write-in request signal BWRn [31] shifts to the low level from the high level, and then the data stored in the cache memory B 26 is read (Read), and is written back to the memory bank 31 through the multiplexer 40 and the bus buffer & register 34 (Write), as shown by the arrow F. The cache read-out request signal CRDn shifts to the high level from the low level after a predetermined pulse period, and the memory bank write-in request signal BWRn [31] shifts to the high level from the low level. The memory bank read-out request signal BRDn [0] shifts to the low level from the high level, and the data stored in the memory bank 0 is read and the output data signal is outputted from the I/O driver 24 through the bus buffer & register 36 and the multiplexer 42 (Read) as shown by the arrow H. Moreover, the cache write-in request signal CWRn shifts from the high level to the low level, and the data stored in the memory bank 0 is read (Read) and written in the cache memory B26 through the bus buffer & register 36 and the multiplexer 38 (Write), as shown by the arrow G. The cache write-in request signal CWRn shifts to high level from the low level after a predetermined pulse period.

As mentioned above, since the write back is executed first of all, the data stored in the cache memory B 26 is read, is buffered to the bus buffer & register 34, and is written in the memory bank 31. Moreover, the data read from the memory bank 0 is written in the cache memory B 26 through the bus buffer & register 36. Thus, since the different bus buffers & registers 34, 36 is used properly, it is possible to start the write-in from the memory bank 0 to the cache memory B 26 before the write back to the memory bank 31 finishes.

As for the memory bank refresh request signal BREFn [1], since the low level is kept up, the refresh in the memory bank 1 is executed continuously (Refresh).

(g) The period T7 of the timing t6 to t7 shows the write-in cache miss state with write back. The cache hit signal HIT is in the low level. Since the input control signal WEn is in the low level at the timing t6, the write-in to the ferroelectric memory device 10 is executed during the period T7. In the period T7, when the cache read-out request signal CRDn shifts to the low level from the high level and the memory bank write-in request signal BWRn [31] shifts to the low level from the high level, the data of the cache memory B 26 is read (Read), and is written back to the memory bank 31 through the multiplexer 40 and the bus buffer & register 34 (Write), as shown by the arrow I. The cache read-out request signal CRDn shifts to the high level from the low level after a predetermined pulse period. Moreover, as shown by the arrow J, the input data signal is written in the cache memory B 26 from the I/O driver 24 (Write). Since the memory bank refresh request signal BREFn [1] shifts to the low level again near the timing t6, after shifting to the high level during predetermined period, the refresh in the memory bank 1 is executed (Refresh).

(h) Since the memory bank refresh request signal BREFn [1] shifts to the low level again near the timing t8, after shifting to the high level predetermined period, as for operation of the period T8 of the timing t7 to t8 and the period T9 of the timing t8 to t9, the refresh in the memory bank 1 is executed as well as the operation of the period T1 (Refresh).

As for the refresh operation of the ferroelectric memory device 10 explained above, although FIG. 16 shows the case over the two cycles of the period T1 and the period T2, it is not limited to this case, and even when the refresh operation extends to a longer cycle, it can apply the present invention.

The examples of FIG. 14 to FIG. 16 explained above show mere examples of the operation timing of the ferroelectric memory device 10, and it is needless to say that the operation timing which combined arbitrarily the interval of T1 to T9 explained with each drawing is also included in the present invention.

In the refresh cycle executed at the time of the DRAM mode operation, it can improve and low power consumption of the data restoring (data write-in in the FRAM mode to all the memory cells) process generated at the time of power supply cutoff can be performed by writing beforehand in data to the refresh object cell in the FRAM mode. In this method, since improvement in the speed of the operation can be achieved by not using the hysteresis characteristic at the time of normal mode, but reducing the capacitor to drive, and polarization inversion is not occurred at the time of normal mode, either, it is effective in the ability to suppress the characteristic degradation of the device.

However, when using this method, since the memory access is executed by high-speed DRAM mode operation and the refresh is executed by the FRAM mode lower speed then the DRAM mode, the refresh cycle time becomes longer than the memory access time.

According to the ferroelectric memory device according to the first embodiment, the cache memory A is provided in the inside of the memory, and when refreshing, the data currently held at the target memory cell (or memory block) is beforehand copied to the cache memory A. When aforementioned block has an external access request in the refresh processing, the refresh processing is continued by using the data in the cache memory A. After completing of the refresh, it writes back the data of the cache memory A to aforementioned block. In this case, the memory cell for refresh (or memory block) is independently completely from the external access request, and can set up the period, which can be refreshed, regardless of the memory access time.

Moreover, when copying the data of the memory cell for refresh (or memory block) to the cache memory A, the period when the memory cell for refresh (or memory block) is not accessed is used, and the external access request is made not to be refused by access for the data copy (concealment of the data copy).

For this reason, the cache memory B is provided and the data accessed once is held into the cache, and even when the specific memory cell for refresh (or memory block) is intensively accessed from the outside, the period for a data copy can be provided since the cache memory B hits.

In this case, in order to certainly be to make a copy, without being because how the cache memory B hitting, the access time for the data copy must be shorter than the memory access time at the time of the DRAM mode used for the external access request. However, since the access for the data copy is executed in the DRAM mode, the above-mentioned restrictions do not pose a problem.

By using the above method, even when the refresh cycle time is longer than the memory access time, the refresh processing can be concealed completely.

According to the present invention, by providing the load capacitor adjustment cell on BL, and setting up the capacitor on BL separately in the DRAM mode and the FRAM mode, the ferroelectric memory device which is compatible in improvement in the speed by BL capacitor reducible in the DRAM mode and BL capacitor securing in the FRAM mode, and can set up the period which can be refreshed regardless of the memory access time, without affecting the external access request, can be provided.

Moreover, according to the present invention, the ferroelectric memory device which is operate by the DRAM operational mode with small capacitor load for high-speed operation at the time of normal operation, is operated by the FRAM operational mode for the data hold of the power OFF period at the time of power ON/OFF, and can improve the data restoring process at the time of power supply cutoff, and can set up the period which can be refreshed regardless of the memory access time, without affecting the external access request, can be provided.

According to the present invention, the operation method of the ferroelectric memory device which can conceal refresh processing completely can be provided even when the refresh cycle time is longer than the memory access time.

According to the present invention, the operation method of the ferroelectric memory device which can suppress the characteristic degradation of the ferroelectric device by the number of times reduction of polarization inversion and can conceal the refresh operation completely can be provided.

According to the present invention, improvement in the speed of operating speed of the same grade as the SRAM can be achieved.

Moreover, according to the present invention, improvement in the speed of the data restoring process at the time of the power supply cutoff can be achieved.

Moreover, according to the present invention, the characteristic degradation of the ferroelectric device by the number of times reduction of polarization inversion can be suppressed.

Other Embodiments

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art.

Accordingly, the technical scope of the present invention is defined by the claims that appear appropriate from the above explanation, as well as by the spirit of the invention. Various modifications will become possible for those skilled in the art after receiving the teachings of the present disclosure without departing from the scope thereof.

INDUSTRIAL APPLICABILITY

The ferroelectric memory device of the present invention is applicable to wide fields, such as a nonvolatile memory and a hybrid (embedded) LSI memory.

REFERENCE SIGNS LIST

10: Ferroelectric memory device;
18, $18_0$, $18_1$, ..., $18_{62}$, $18_{63}$: Memory bank (Bank);
20: Cache bank (cache memory A);
22: Bus switching unit;
24, 25: I/O control unit (I/O driver);
26: Cache memory B;
27: Determination circuit;
28: Buffer control circuit;
30: Address buffer;
32: Memory bank/Cache control sequencer;
33: Memory bank control sequencer;
34, 36: Bus buffer & register;
38, 40, 42, 52, 54: Multiplexer;
40a, 40b, 40c, 40d: Row decoder;
42, 42a, 42b, 42c, 42d: WL/PL driver;
44a, 44b: FRAM cell array unit;
48: Predecoder;
50: Sense amplifier and column decoder;
60: Ferroelectric memory cell;
62: Sense amplifier (SA);
64: Load capacitor adjustment cell;
66: Load capacitor switching unit;
66a, 66b: Load capacitor adjustment array unit;
BLC: Bit line capacitor control line;
$C_F$, $C_{F1}$, $C_{F2}$, $C_{F3}$: Ferroelectric capacitor;
$C_S$: Value of ferroelectric capacitor $C_F$;
$C_B$: Bit line capacitor;
$C_L$: Load capacitor;
$V_S$: Voltage stored in ferroelectric capacitor $C_F$;
$V_B$: Voltage of bit line BL;
BL, BLn, BL0, BL0n, BL1, BL1n: Bit line;
WL, WL0, WL1: Word line;
PL, PL0, PL1: Plate line;
A, AD, ADDR: Address signal;
AEn: Address enable signal;
DS: Data signal;
RDL: Read-out data signal;
WDL: Write-in data signal;
WLC: Word line control signal;
PLC: Plate line control signal;
BLCC: Bit line capacitor control signal;
SAE: Sense amplifier control signal;
OE, OEn: Output control signal;
WE, WEn: Input control signal;
CEn: Memory effective signal;
CLK: Clock signal;
HIT: Cache hit signal;
CRDn: Cache read-out request signal;
CWRn: Cache write-in request signal;
BRDn: Memory bank read-out request signal;
BWRn: Memory bank write-in request signal;
BBUS: Bus select signal;
REFA: Refresh/copy selected address signal;
BREFn: Memory bank refresh request signal;
IO: Input output data signal;
CRDL: Cache read-out signal line;
CWDL: Cache write-in signal line;
DRDL: Data read-out signal line; and
DWDL: Data write-in signal line.

The invention claimed is:

1. A ferroelectric memory device comprising:
a plurality of memory banks configured to include a memory cell array composed of a ferroelectric memory;
a cache bank configured to be bus-connected with the memory banks, and for copying data stored in the memory banks; and
a memory bank/cache control sequencer for accessing and refreshing to the memory banks and the cache bank,
wherein a random access control to the ferroelectric memory is possible during each memory cycle without delay of refresh operation, and
wherein the ferroelectric memory includes: a plurality of bit lines placed at a column direction; a plurality of word lines which intersects perpendicularly with the bit lines and are placed at a row direction; a plurality of plate lines which intersects perpendicularly with the bit lines and are placed at a row direction; a bit line control line which intersects perpendicularly with the bit lines and is placed at a row direction; a ferroelectric capacitor placed at an intersection of a plurality of the bit lines, a plurality of the word lines, and the plate line, an electrode of one side of the ferroelectric capacitor being connected to the plate line; a ferroelectric memory cell composed of a memory cell transistor by which one side of one of a source and a drain is connected to the electrode of another side of the ferroelectric capacitor, another side of one of the source and the drain is connected to the bit line, and a gate is connected to the word line; a load capacitor placed at an intersection of a plurality of the bit lines and the bit line control line, an electrode of one side of the load capacitor being connected to ground potential; and a load capacitor adjustment cell composed of a load capacitor adjustment transistor by which one side of one of a source and a drain is connected to the electrode of another side of the load capacitor, another side of one of the source and the drain is connected to the bit line, and a gate is connected to the bit line control line.

2. The ferroelectric memory device according to claim 1, wherein
the ferroelectric capacitor includes at least one ferroelectric thin film layer.

3. The ferroelectric memory device according to claim 2, wherein
when reading the data in the ferroelectric memory cell, the load capacitor adjustment cell switches the capacitor of the bit line by the case of being held with the quantity of electrical charges charged by the ferroelectric capacitor, and the case of being held by the quantity of electrical charges of residual polarization inside the ferroelectric thin film layer.

4. The ferroelectric memory device according to claim 3, wherein
when held with the quantity of electrical charges charged by the ferroelectric capacitor, data is held also as the quantity of electrical charges of residual polarization inside the ferroelectric thin film layer at the time of the refresh operation.

5. The ferroelectric memory device according to claim 3, wherein
after power supply cutoff, data is held for the memory cell, which does not hold data as quantity of electrical charges of residual polarization inside the ferroelectric thin film layer, as quantity of electrical charges of residual polarization inside the ferroelectric thin film layer.

6. The ferroelectric memory device according to claim 3, wherein
after powering ON, data is held for the memory cell, which holds data as quantity of electrical charges of residual polarization inside the ferroelectric thin film layer, as quantity of electrical charges charged by the ferroelectric capacitor.

7. The ferroelectric memory device according to claim 1, wherein
data stored in the ferroelectric memory cell is held by one of electrical charges charged by the ferroelectric capacitor and quantity of electrical charges of residual polarization inside the ferroelectric thin film layer.

8. The ferroelectric memory device according to claim 1, wherein
a capacitor of the bit line to which the ferroelectric memory cell is connected is adjusted.

9. The ferroelectric memory device according to claim 1, wherein
the refresh operation is executed per memory bank.

10. The ferroelectric memory device according to claim 1 further comprising:
a cache memory configured to include a determination circuit for determining whether there is any target data when accessed.

11. The ferroelectric memory device according to claim 10, wherein
when the ferroelectric memory device is accessed, the cache memory is accessed when the cache memory has target data and when being a cache hit, and the target memory bank is accessed in the case of read-out, and the data stored in the cache memory is written back to the original memory bank in the case of write-in, when the cache memory has no target data and when being a cache miss.

12. An operating method for a ferroelectric memory device comprising a plurality of memory banks configured to include a memory cell array composed of a ferroelectric memory; a cache bank configured to be bus-connected with the memory banks, and for copying data stored in the memory banks; and a memory bank/cache control sequencer for accessing and refreshing to the memory banks and the cache bank, wherein a random access control to the ferroelectric memory is possible during each memory cycle without delay of refresh operation, and wherein the ferroelectric memory includes: a plurality of bit lines placed at a column direction; a plurality of word lines which intersects perpendicularly with the bit lines and are placed at a row direction; a plurality of plate lines which intersects perpendicularly with the bit lines and are placed at a row direction; a bit line control line which intersects perpendicularly with the bit lines and is placed at a row direction; a ferroelectric capacitor placed at an intersection of a plurality of the bit lines, a plurality of the word lines, and the plate line, an electrode of one side of the ferroelectric capacitor being connected to the plate line; a ferroelectric memory cell composed of a memory cell transistor by which one side of one of a source and a drain is connected to the electrode of another side of the ferroelectric capacitor, another side of one of the source and the drain is connected to the bit line, and a gate is connected to the word line; a load capacitor placed at an intersection of a plurality of the bit lines and the bit line control line, an electrode of one side of the load capacitor being connected to ground potential; and a load capacitor adjustment cell composed of a load capacitor adjustment transistor by which one side of one of a source and a drain is connected to the electrode of another side of the load capacitor, another side of one of the source and the drain is connected to the bit line, and a gate is connected to the bit line control line, the method comprising:
copying data currently held at one of the memory cell for refresh and a memory block to the cache bank when refreshing;
using the data stored in the cache bank and continuing the refresh processing when an external access request is sent to the memory block in the refresh processing; and
writing back the data stored in the cache bank to the memory block after completing the refresh.

13. The operating method for the ferroelectric memory device according to claim 12, wherein one of the memory cell for refresh and the memory block is completely independent from an external access request, and can set up a period which can be refreshed regardless of a memory access time.

14. The operating method for the ferroelectric memory device according to claim 12, wherein
when copying the data stored in one of the memory cell for refresh and the memory block to the cache bank, a period when one of the memory cell for refresh and the memory block is not accessed is used, and the data copy is concealed so that an external access request is not refused by access for the data copy.

15. The operating method for the ferroelectric memory device according to claim 12, wherein the ferroelectric memory device further comprises a cache memory, and the data accessed once is held in the cache memory, and even when one of the specific memory cell for refresh and the specific memory block is intensively accessed from the outside, the period for the data copy can be set up since the cache memory hits.

16. An operating method for a ferroelectric memory device comprising:
determining whether a cache memory has target data when the ferroelectric memory device is accessed;
accessing the cache memory when the cache memory has target data and when being a cache hit;
accessing a target memory bank in the case of read-out when the cache memory has target data and when being a cache miss; and
writing back the data stored in the cache memory to an original memory bank in the case of write-in when the cache memory has target data and when being a cache miss, and wherein
the ferroelectric memory device comprises: a plurality of memory banks configured to include a memory cell array composed of a ferroelectric memory; the cache bank configured to be bus-connected with the memory banks, and for copying data stored in the memory banks; a memory bank/cache control sequencer for accessing and refreshing to the memory banks and the cache bank; and a cache memory configured to include a determination circuit for determining whether there is any target data when accessed,
wherein a random access control to the ferroelectric memory is possible during each memory cycle without delay of refresh operation, and
wherein the ferroelectric memory includes: a plurality of bit lines placed at a column direction; a plurality of word lines which intersects perpendicularly with the bit lines and are placed at a row direction; a plurality of plate lines which intersects perpendicularly with the bit lines and are placed at a row direction; a bit line control line which intersects perpendicularly with the bit lines and is placed at a row direction; a ferroelectric capacitor placed at an intersection of a plurality of the bit lines, a plurality of the word lines, and the plate line, an electrode of one side of the ferroelectric capacitor being connected to the plate line; a ferroelectric memory cell composed of a memory cell transistor by which one side of one of a source and a drain is connected to the electrode of another side of the ferroelectric capacitor, another side of one of the source and the drain is connected to the bit line, and a gate is connected to the word line; a load capacitor placed at an intersection of a plurality of the bit lines and the bit line control line, an electrode of one side of the load capacitor being connected to ground potential; and a load capacitor adjustment cell composed of a load capacitor adjustment transistor by which one side of one of a source and a drain is connected to the electrode of another side of the load capacitor, another side of one of the source and the drain is connected to the bit line, and a gate is connected to the bit line control line.

17. An operating method for a ferroelectric memory device comprising a plurality of memory banks configured to include a memory cell array composed of a ferroelectric memory; a cache bank configured to be bus-connected with the memory banks, and for copying data stored in the memory banks; and a memory bank/cache control sequencer for accessing and refreshing to the memory banks and the cache bank, the method comprising:
    copying data currently held at one of a memory cell for refresh and a memory block to the cache bank when refreshing;
    using the data stored in the cache bank and continuing the refresh processing when an external access request is sent to the memory block in the refresh processing; and
    writing back the data stored in the cache bank to the memory block after completing the refresh,
    wherein one of the memory cell for refresh and the memory block is completely independent from an external access request, and can set up a period which can be refreshed regardless of a memory access time.

18. An operating method for a ferroelectric memory device comprising a plurality of memory banks configured to include a memory cell array composed of a ferroelectric memory; a cache bank configured to be bus-connected with the memory banks, and for copying data stored in the memory banks; and a memory bank/cache control sequencer for accessing and refreshing to the memory banks and the cache bank, the method comprising:
    copying data currently held at one of a memory cell for refresh and a memory block to the cache bank when refreshing;
    using the data stored in the cache bank and continuing the refresh processing when an external access request is sent to the memory block in the refresh processing; and
    writing back the data stored in the cache bank to the memory block after completing the refresh,
    wherein when copying the data stored in one of the memory cell for refresh and the memory block to the cache bank, a period when one of the memory cell for refresh and the memory block is not accessed is used, and the data copy is concealed so that an external access request is not refused by access for the data copy.

19. An operating method for a ferroelectric memory device comprising a plurality of memory banks configured to include a memory cell array composed of a ferroelectric memory; a cache memory; a cache bank configured to be bus-connected with the memory banks, and for copying data stored in the memory banks; and a memory bank/cache control sequencer for accessing and refreshing to the memory banks and the cache bank, the method comprising:
    copying data currently held at one of a memory cell for refresh and a memory block to the cache bank when refreshing;
    using the data stored in the cache bank and continuing the refresh processing when an external access request is sent to the memory block in the refresh processing; and
    writing back the data stored in the cache bank to the memory block after completing the refresh,
    wherein the data accessed once is held in the cache memory, and even when one of the specific memory cell for refresh and the specific memory block is intensively accessed from the outside, the period for the data copy can be set up since the cache memory hits.

* * * * *